(12) United States Patent
Woodruff et al.

(10) Patent No.: US 7,313,462 B2
(45) Date of Patent: Dec. 25, 2007

(54) INTEGRATED TOOL WITH AUTOMATED CALIBRATION SYSTEM AND INTERCHANGEABLE WET PROCESSING COMPONENTS FOR PROCESSING MICROFEATURE WORKPIECES

(75) Inventors: Daniel J. Woodruff, Kalispell, MT (US); David P. Mattson, Kalispell, MT (US); James J. Erickson, Kalispell, MT (US); Matthew C. Egloff, Butte-Silver Bow, MT (US)

(73) Assignee: Semitool, Inc., Kalispell, MT (US)

( * ) Notice: Subject to any disclaimer, the term of this patent is extended or adjusted under 35 U.S.C. 154(b) by 740 days.

(21) Appl. No.: 10/860,385

(22) Filed: Jun. 3, 2004

(65) Prior Publication Data

US 2005/0109088 A1 May 26, 2005

Related U.S. Application Data

(60) Provisional application No. 60/501,566, filed on Sep. 9, 2003, provisional application No. 60/476,786, filed on Jun. 6, 2003, provisional application No. 60/476,776, filed on Jun. 6, 2003, provisional application No. 60/476,333, filed on Jun. 6, 2003, provisional application No. 60/476,881, filed on Jun. 6, 2003.

(51) Int. Cl.
*G06F 19/00* (2006.01)

(52) U.S. Cl. .............. 700/245; 700/249; 700/250; 700/258; 700/259; 700/260; 700/261; 700/262; 700/264; 414/744.5; 414/744.6; 901/49

(58) Field of Classification Search ............. 700/245, 700/249, 250, 258, 259, 260, 261, 262, 264; 717/744.5, 744.6; 901/49
See application file for complete search history.

(56) References Cited

U.S. PATENT DOCUMENTS

| 5,177,563 | A | * | 1/1993 | Everett et al. ............. 356/621 |
| 5,284,554 | A | | 2/1994 | Datta |
| 5,312,532 | A | | 5/1994 | Andricacos |
| 5,344,491 | A | | 9/1994 | Katou |

(Continued)

FOREIGN PATENT DOCUMENTS

EP   0 343 502 A2   11/1989

(Continued)

OTHER PUBLICATIONS

Wu, Bill (Qunwei) et al., "Methods for Characterizaton of Mass Transfer Boundary Layer in an Industrial Semiconductor Wafer Plating Cell," Abs. 165, 205th Meeting, The Electrochemical Society, Inc. (2000).

*Primary Examiner*—Thomas Black
*Assistant Examiner*—McDieunel Marc
(74) *Attorney, Agent, or Firm*—Perkins Coie LLP

(57) ABSTRACT

An integrated tool and automatic calibration systems that enable wet chemical processing chambers, lift-rotate units and other hardware to be quickly interchanged without having to recalibrate the transport system or other components to the replacement items. These tools are expected to reduce the down time associated with repairing or maintaining processing chambers and/or lift-rotate units so that the tools can maintain a high throughput. Several aspects of these tools are particularly useful for applications that have stringent performance requirements because components are more likely to require maintenance more frequently, and reducing the down time associated with maintaining such components will significantly enhance the integrated tool.

7 Claims, 23 Drawing Sheets

U.S. PATENT DOCUMENTS

| | | |
|---|---|---|
| 5,344,539 A | 9/1994 | Shinogi |
| 5,421,987 A | 6/1995 | Tzanavaras |
| 5,431,421 A | 7/1995 | Thompson |
| 5,455,497 A * | 10/1995 | Hirose et al. .......... 318/568.12 |
| 5,476,577 A | 12/1995 | May |
| 5,486,282 A | 1/1996 | Datta |
| 5,516,412 A | 5/1996 | Andricacos |
| 5,531,874 A | 7/1996 | Brophy |
| 5,536,388 A | 7/1996 | Dinan |
| 5,543,032 A | 8/1996 | Datta |
| 5,567,300 A | 10/1996 | Datta |
| 5,579,444 A * | 11/1996 | Dalziel et al. ............... 700/259 |
| 5,614,076 A | 3/1997 | Brophy |
| 5,617,515 A * | 4/1997 | MacLaren et al. .......... 700/264 |
| 5,865,984 A | 2/1999 | Corbin, Jr. |
| 5,925,226 A | 7/1999 | Hurwitt |
| 6,001,235 A | 12/1999 | Arken |
| 6,024,856 A | 2/2000 | Haydu |
| 6,037,790 A | 3/2000 | Dinan |
| 6,044,308 A * | 3/2000 | Huissoon .................... 700/166 |
| 6,103,096 A | 8/2000 | Datta |
| 6,132,586 A | 10/2000 | Adams |
| 6,197,182 B1 | 3/2001 | Kaufman |
| 6,228,231 B1 | 5/2001 | Uzoh |
| 6,251,250 B1 | 6/2001 | Keigler |
| 6,321,137 B1 * | 11/2001 | De Smet ..................... 700/245 |
| 6,328,872 B1 | 12/2001 | Talieh |
| 6,454,918 B1 | 9/2002 | Sakaki |
| 6,547,937 B1 | 4/2003 | Oberlitner |
| 6,587,752 B1 * | 7/2003 | Saito .......................... 700/264 |
| 6,826,452 B1 * | 11/2004 | Holland et al. .............. 700/245 |
| 6,934,606 B1 * | 8/2005 | Genetti et al. ............... 700/254 |
| 2002/0088708 A1 | 7/2002 | Sakaki |
| 2003/0221953 A1 | 12/2003 | Oberlitner |

FOREIGN PATENT DOCUMENTS

| | | |
|---|---|---|
| EP | 0 726 698 A2 | 8/1996 |
| JP | 62-297494 | 12/1987 |
| JP | 62297495 | 12/1987 |
| JP | 1120827 | 5/1989 |
| JP | 5175158 | 7/1993 |
| JP | 6260468 | 4/1994 |
| JP | 7211724 | 8/1995 |
| JP | 7284738 | 10/1995 |
| JP | 10172974 | 6/1998 |
| JP | 11092993 | 4/1999 |
| JP | 2000017480 | 1/2000 |
| JP | 2001064795 | 3/2001 |
| WO | WO-99/25004 | 5/1999 |
| WO | WO-01/00173 | 1/2001 |

* cited by examiner

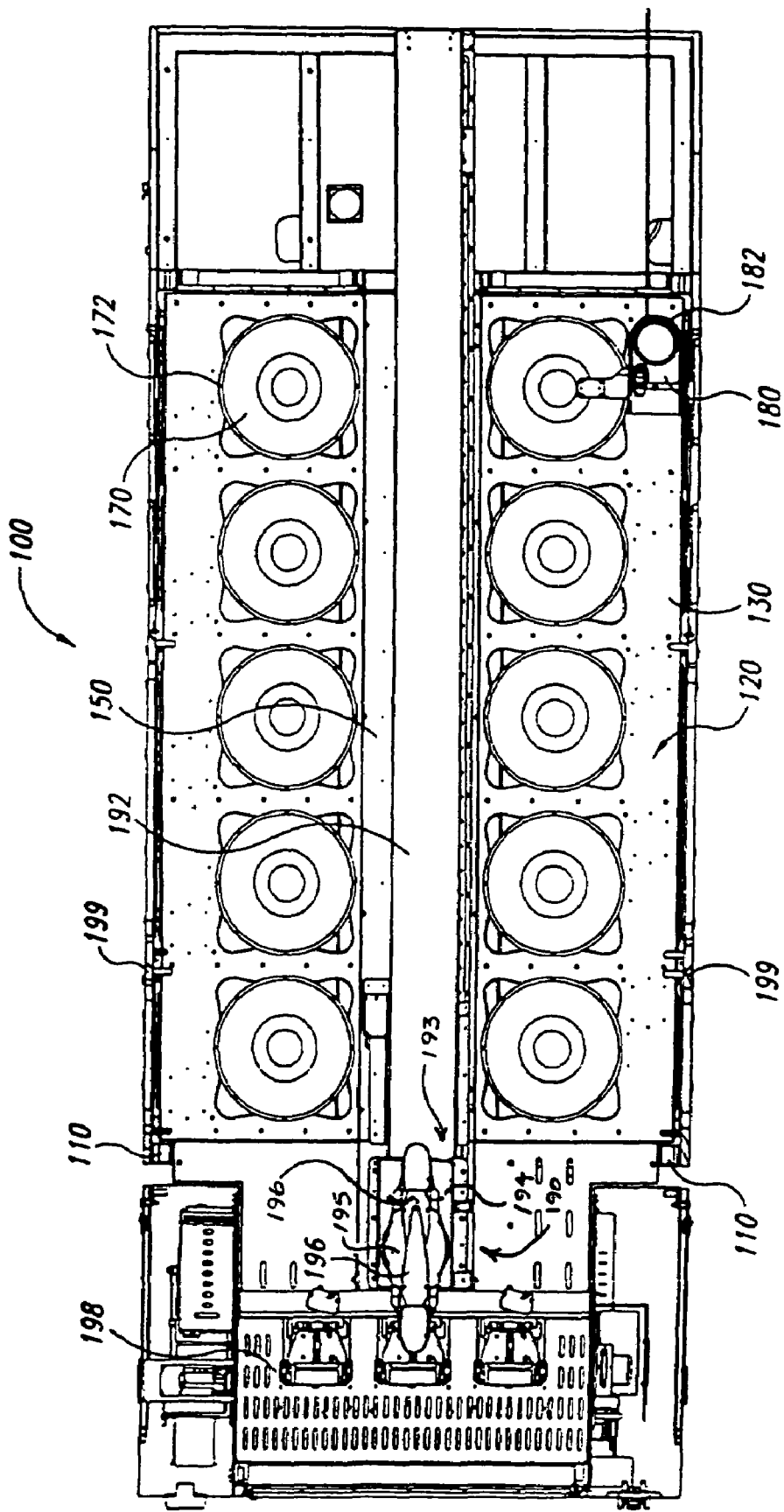

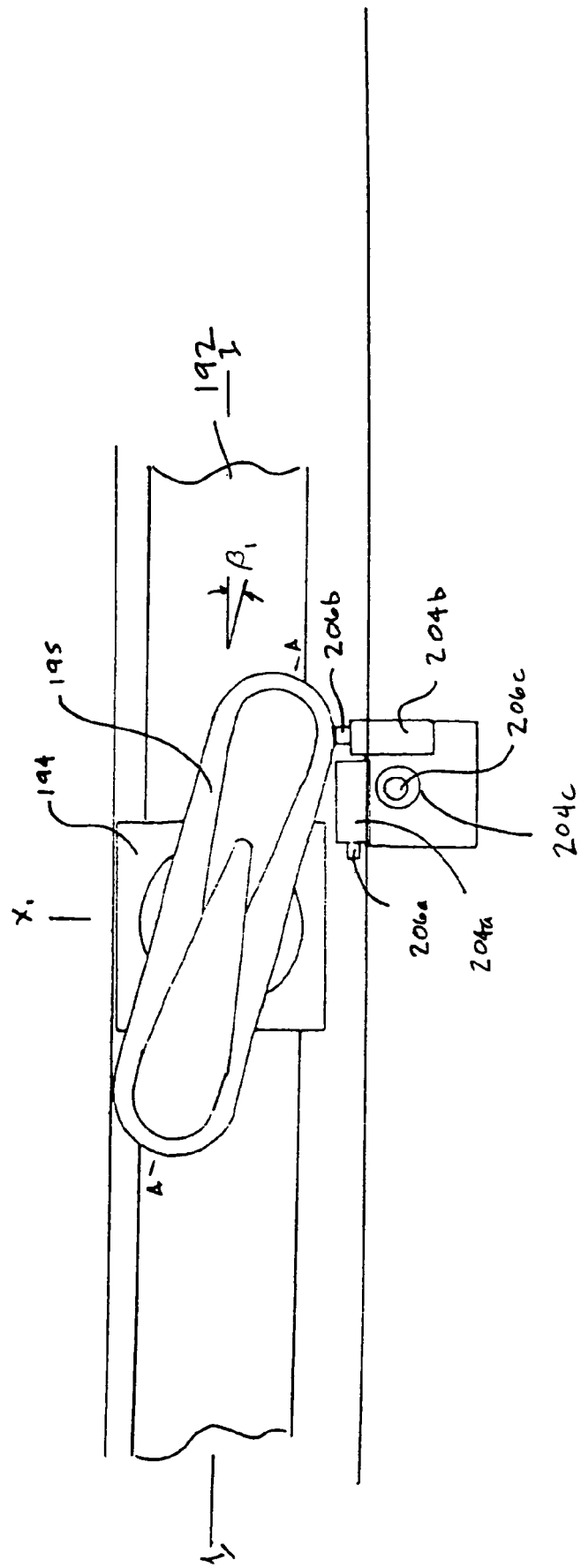

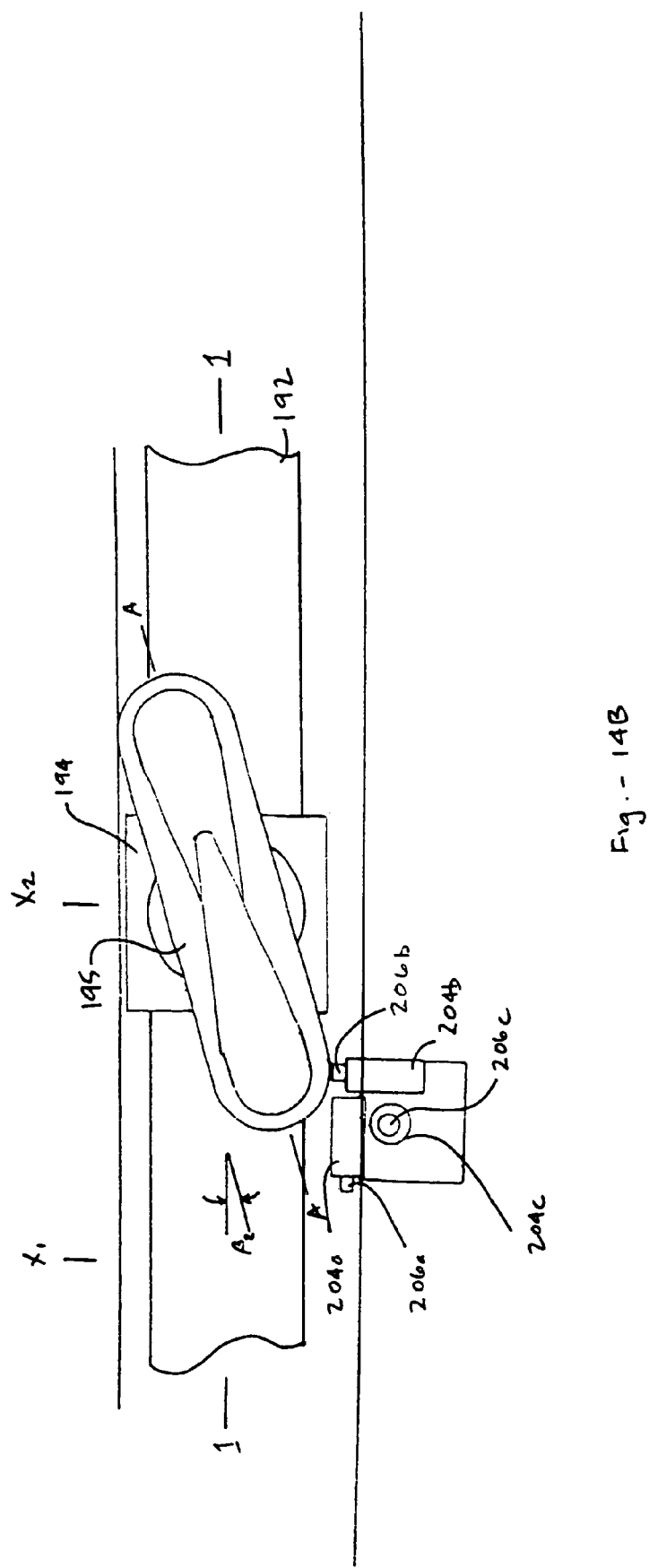

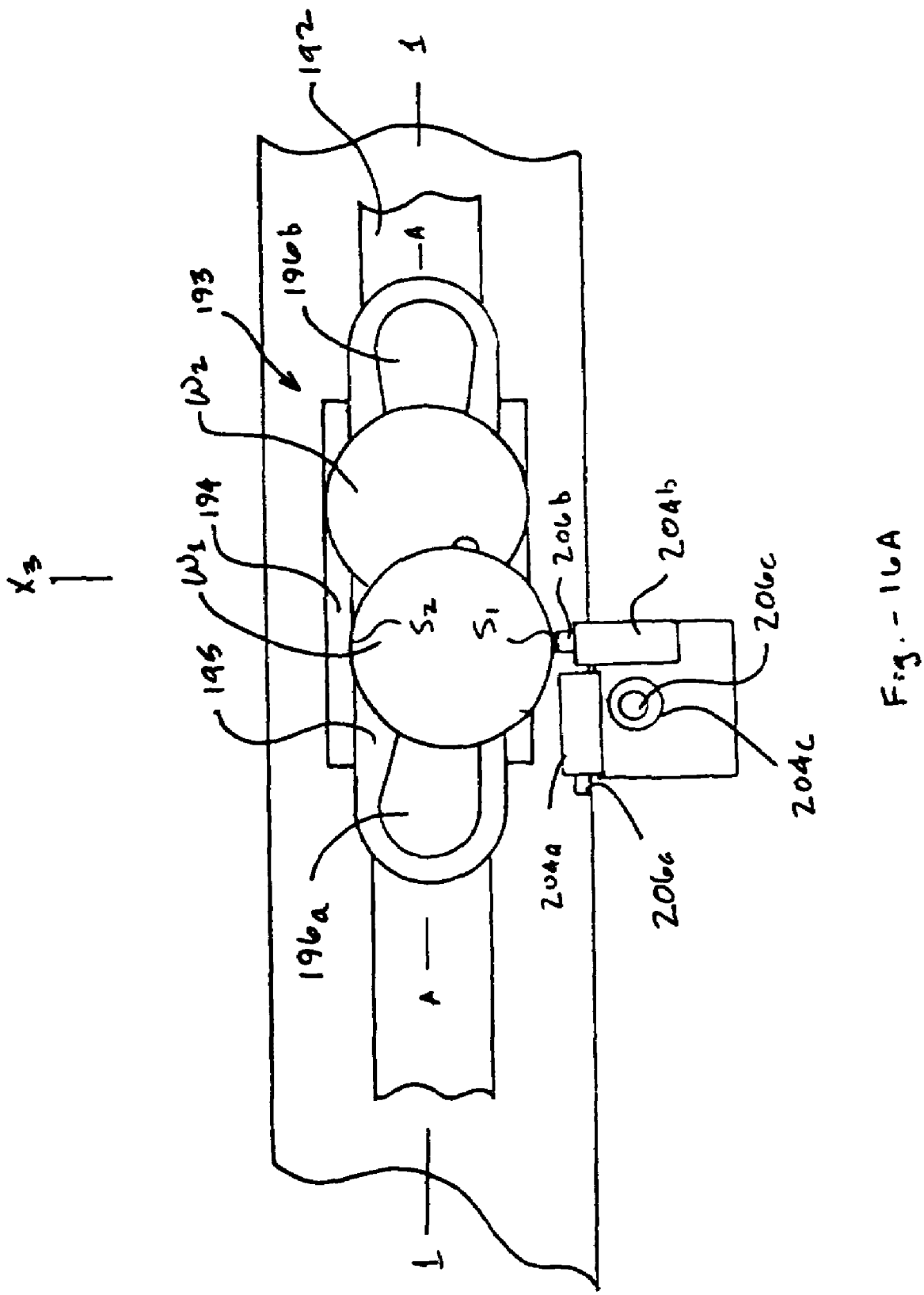

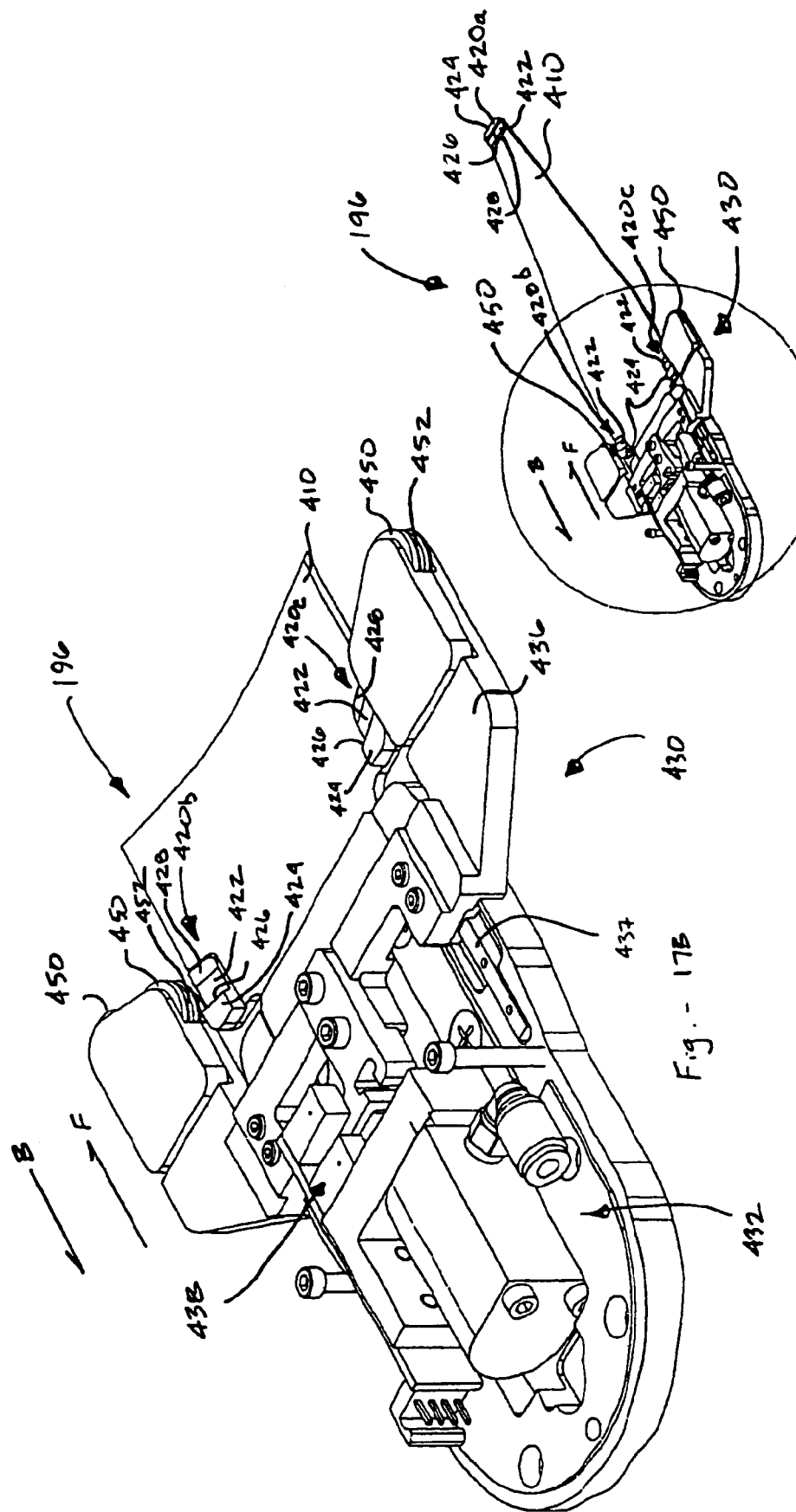

_US 7,313,462 B2_

INTEGRATED TOOL WITH AUTOMATED CALIBRATION SYSTEM AND INTERCHANGEABLE WET PROCESSING COMPONENTS FOR PROCESSING MICROFEATURE WORKPIECES

CROSS-REFERENCE TO RELATED APPLICATIONS

The present application claims the benefit of U.S. Application No. 60/476,786 filed on Jun. 6, 2003; 60/476,776 filed on Jun. 6, 2003; and 60/501,566 filed on Sep. 9, 2003, all of which are incorporated herein in their entirety, including appendices, by reference. Additionally, U.S. Application No. 60/476,333 filed on Jun. 6, 2003 and 60/476,881 filed on Jun. 6, 2003 are also incorporated herein in their entirety, including appendices, by reference.

TECHNICAL FIELD

The present invention is directed toward apparatus and methods for processing microfeature workpieces having a plurality of microdevices integrated in and/or on the workpieces. The microdevices can include submicron features. Particular aspects of the present invention are directed toward an automated calibration system for positioning a robotic transport system relative to a dimensionally stable mounting module.

BACKGROUND

Microdevices are manufactured by depositing and working several layers of materials on a single substrate to produce a large number of individual devices. For example, layers of photoresist, conductive materials, and dielectric materials are deposited, patterned, developed, etched, planarized, and otherwise manipulated to form features in and/or on a substrate. The features are arranged to form integrated circuits, micro-fluidic systems, and other structures.

Wet chemical processes are commonly used to form features on microfeature workpieces. Wet chemical processes are generally performed in wet chemical processing tools that have a plurality of individual processing chambers for cleaning, etching, electrochemically depositing materials, or performing combinations of these processes. FIG. 1 schematically illustrates an integrated tool 10 that can perform one or more wet chemical processes. The tool 10 includes a housing or cabinet 20 having a platform 22, a plurality of wet chemical processing chambers 30 in the cabinet 20, and a transport system 40. The tool 10 also includes lift-rotate units 32 coupled to each processing chamber 30 for loading/unloading the workpieces W. The processing chambers 30 can be rinse/dry chambers, cleaning capsules, etching capsules, electrochemical deposition chambers, or other types of wet chemical processing vessels. The transport system 40 includes a linear track 42 and a robot 44 that moves along the track 42 to transport individual workpieces W within the tool 10. The integrated tool 10 further includes a workpiece storage unit 60 having a plurality of containers 62 for holding workpieces W. In operation, the robot 44 transports workpieces to/from the containers 62 and the processing chambers 30 according to a predetermined workflow within the tool 10.

Automated handling of workpieces is an important aspect in the performance of semiconductor processing tools. As shown in FIG. 1, the robot 44 must accurately transfer and position workpieces at six different processing chambers 30 and two containers 62. The robot 44 moves the workpieces W among the processing chambers 30 and the containers 62 by moving along the track 42, rotating about several pivot points, and raising/lowering the workpiece W in a variety of complex motions.

One challenge of automated handling of workpieces is to properly calibrate the various components of the transport system 40 to move accurately to/from the processing chambers 30 and the containers 62. The transport system 40 is calibrated by "teaching" the robot 44 the specific positions of the chambers 30 and containers 62. Conventional processes for teaching the robot 44 usually involve manually positioning the robot 44 at a desired location with respect to each chamber 30 and each container 62. The encoder value corresponding to the position of the robot at each of these components is recorded and inputted as a program value. In addition to teaching the robot specific locations within the tool, the arms and end-effectors of the robot must be aligned with the reference frame in which the program values for the processing chambers 30 and the containers 62 were recorded. Although manually aligning the components of the robot to the reference frame and manually teaching the robot the location of each processing chamber 30 and container 62 is an accepted process for setting up the transport system 40, it is also extremely time consuming and subject to operator error. For example, it takes approximately 6-8 hours to align the components of a dual end-effector robot to the reference frame and to teach the robot the locations of ten chambers and two containers. Moreover, the quality of each point input as a program value is subject to operator error because it is often difficult to accurately position the robot in one or more of the chambers 30 or containers 62.

Another challenge to operating integrated wet chemical processing tools is that the processing chambers must be maintained and/or repaired periodically. In electrochemical deposition chambers, for example, consumable electrodes degrade over time because the reaction between the electrodes and the electrolytic solution decomposes the electrodes. The shape of consumable electrodes accordingly changes causing variations in the electrical field. As a result, consumable electrodes must be replaced periodically to maintain the desired deposition parameters across the workpiece. The electrical contacts that contact the workpiece also may need to be cleaned or replaced periodically. To maintain or repair electrochemical deposition chambers, they are typically removed from the tool 10 and replaced with an extra chamber.

One problem with repairing or maintaining existing wet chemical processing chambers is that the tool must be taken offline for an extended period of time to remove and replace the processing chambers 30 from the tool 10. When the processing chamber 30 is removed from the tool 10, a pre-maintained processing chamber 30 is mounted to the platform 22 at the vacant station, and then the lift-rotate unit 32 is recalibrated to operate with the new processing chamber. The robot 44 is then re-taught to operate with the new position of the lift-rotate unit 32. This is a time-consuming process that increases the downtime for repairing or maintaining processing chambers for the reasons explained above. As a result, when only one processing chamber 30 of the tool 10 does not meet specifications, it is often more efficient to continue operating the tool 10 without stopping to repair the one processing chamber 30 until more processing chambers do not meet the performance specifications. The loss of throughput of a single processing chamber 30, therefore, is not as severe as the loss of throughput caused by taking the tool 10 offline to repair or maintain a single one of the processing chambers 30.

The practice of operating the tool 10 until at least two processing chambers 30 do not meet specifications severely impacts the throughput of the tool 10. For example, if the tool 10 is not repaired or maintained until at least two or three processing chambers 30 are out of specification, then the tool operates at only a fraction of its full capacity for a period of time before it is taken offline for maintenance. This increases the operating costs of the tool 10 because the throughput not only suffers while the tool 10 is offline to replace the wet processing chambers 30 and reteach the robot 44, but the throughput is also reduced while the tool is online because it operates at only a fraction of its full capacity. Moreover, as the feature sizes decrease, the electrochemical deposition chambers 30 must consistently meet much higher performance specifications. This causes the processing chambers 30 to fall out of specifications sooner, which results in shutting down the tool more frequently. Therefore, the downtime associated with calibrating the transport system and repairing/maintaining electrochemical deposition chambers is significantly increasing the cost of operating wet chemical processing tools.

SUMMARY

One aspect of the present invention is directed toward a platform, a transport system, and a calibration system for quickly aligning a robot of the transport system to the platform. The platform can be a dimensionally stable mounting module that carries the transport system and one or more processing chambers. The calibration system automatically aligns the robot to the mounting module or a reference frame relative to the mounting module. Moreover, the processing chambers or other stations are attached to the mounting module at precise locations in the reference frame. As a result, once the robot is aligned to the reference frame, the robot can interface with the processing chambers or other stations without specifically teaching the robot the location of the specific chambers. In one embodiment, for example, the robot does not need to be taught the specific location of each station or cassette by moving the robot to the desired wafer locations and inputting the encoder values for each position. It is expected that several embodiments of the automated calibration system will align the robot with the reference frame and the processing chambers in a period of less than 45 minutes. In other embodiments, the automated calibration system is expected to do this in less than 15 minutes, or even less than five minutes. For example, one embodiment of the automated calibration system can position the robot to operate with ten processing chambers and two containers within approximately 8-10 minutes. As such, the calibration system is expected to reduce the downtime by several hours.

Another aspect of the present invention is directed toward an integrated tool that enables wet chemical processing chambers, lift-rotate units and other hardware to be quickly interchanged without having to recalibrate the transport system or other components of the tool. This is expected to reduce the down time associated with repairing or maintaining processing chambers and/or lift-rotate units so that the tool can remain online for a larger percentage of available operating time. Moreover, reducing the downtime for maintenance makes it more economical to repair each chamber as needed instead of waiting for two or more chambers to fall out of specifications. Several aspects of the invention are particularly useful for applications that have stringent performance requirements because the processing chambers are likely to require maintenance more frequently, and reducing the down time associated with frequently maintaining such components will significantly enhance the throughput of the integrated tool.

One embodiment of an integrated tool for wet chemical processing of microfeature workpieces includes a frame, a mounting module carried by the frame, a wet chemical processing chamber carried by the mounting module, and a transport system carried by the mounting module. The mounting module includes a plurality of positioning elements and attachment elements. In one embodiment, the mounting module is configured to maintain relative positions between the positioning elements to within a range that does not require the transport system to be recalibrated when the processing chamber is replaced for repair or maintenance. The mounting module, for example, can include a deck having a rigid outer panel, a rigid interior panel juxtaposed to the outer panel, and joists or other types of bracing between the outer and interior panels. The outer panel, the bracing and the interior panel are fastened together to create a structure that does not deflect, warp or otherwise change its dimension to maintain the relative positions between the positioning elements on the deck.

The wet chemical processing chamber has a first interface member engaged with one of the positioning elements and a first fastener engaged with one of the attachment elements. Similarly, the transport system has a second interface member engaged with one of the positioning elements and a second fastener engaged with one of the attachment elements. By engaging the interface members of the processing chamber and the transport system with positioning elements of the mounting module, the wet chemical processing chamber and the transport system are precisely located at known locations on the mounting module. Moreover, because the mounting module is dimensionally stable, the relative position between the wet chemical processing chamber and the transport system can be consistently maintained after replacing one wet chemical processing chamber with another. These two aspects of the tool enable the transport system to transport workpieces to/from the processing chambers without having to recalibrate the transport system each time a processing chamber is removed and replaced for maintenance.

BRIEF DESCRIPTION OF THE DRAWINGS

FIG. 2B is a top plan view of a wet chemical processing tool in accordance with an embodiment of the invention.

FIGS. 14A and 14B are top plan views illustrating other stages for calibrating a robot of a transport system in accordance with another embodiment of the invention.

FIGS. 16A and 16B are top plan views illustrating other stages of a method for calibrating a robot of a transport system in accordance with an embodiment of the invention.

FIGS. 17A and 17B are isometric views illustrating an end-effector for use with a transport system in accordance with an embodiment of the invention.

DETAILED DESCRIPTION

As used herein, the terms "microfeature workpiece" or "workpiece" refer to substrates on or in which microelectronic devices are formed integrally. Typical microdevices include microelectronic circuits or components, thin-film recording heads, data storage elements, microfluidic devices, and other products. Micromachines or micromechanical devices are included within this definition because they are manufactured using much of the same technology that is used in the fabrication of integrated circuits. The substrates can be semiconductive pieces (e.g., doped silicon wafers or gallium arsenide wafers), nonconductive pieces (e.g., various ceramic substrates), or conductive pieces.

Several embodiments of integrated tools for wet chemical processing of microfeature workpieces are described in the context of depositing metals or electrophoretic resist in or on structures of a workpiece. The integrated tools in accordance with the invention, however, can also be used in etching, rinsing or other types of wet chemical processes in the fabrication of microfeatures in and/or on semiconductor substrates or other types of workpieces. Several embodiments of tools in accordance with the invention are set forth in FIGS. 2A-20 and the following text provide a thorough understanding of particular embodiments of the invention.

The description is divided into the following sections: (A) Embodiments of Integrated Tools With Mounting Modules; (B) Embodiments of Dimensionally Stable Mounting Modules; (C) Embodiments of Wet Chemical Processing Chambers; (D) Embodiments of Lift-Rotate Units and Load/Unload Modules; (E) System and Methods for Automated Robot Calibration; and (F) Embodiments of End-Effectors. A person skilled in the art will understand, however, that the invention may have additional embodiments, or that the invention may be practiced without several of the details of the embodiments shown in FIGS. 2A-20.

A. Embodiments of Integrated Tools with Mounting Modules

Figure 1:
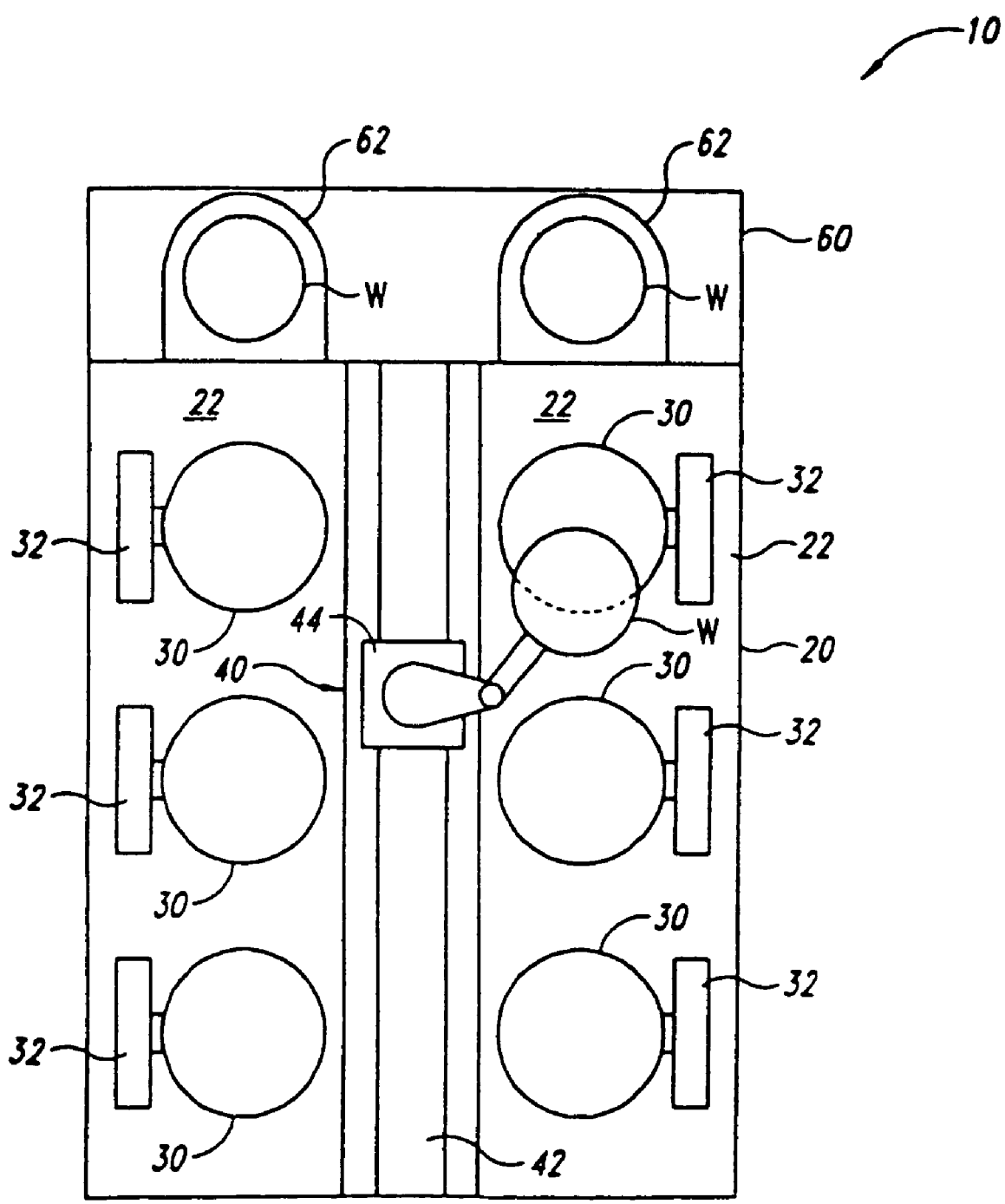
FIG. 1 is a schematic top plan view of a wet chemical processing tool in accordance with the prior art.
Figure 2A:
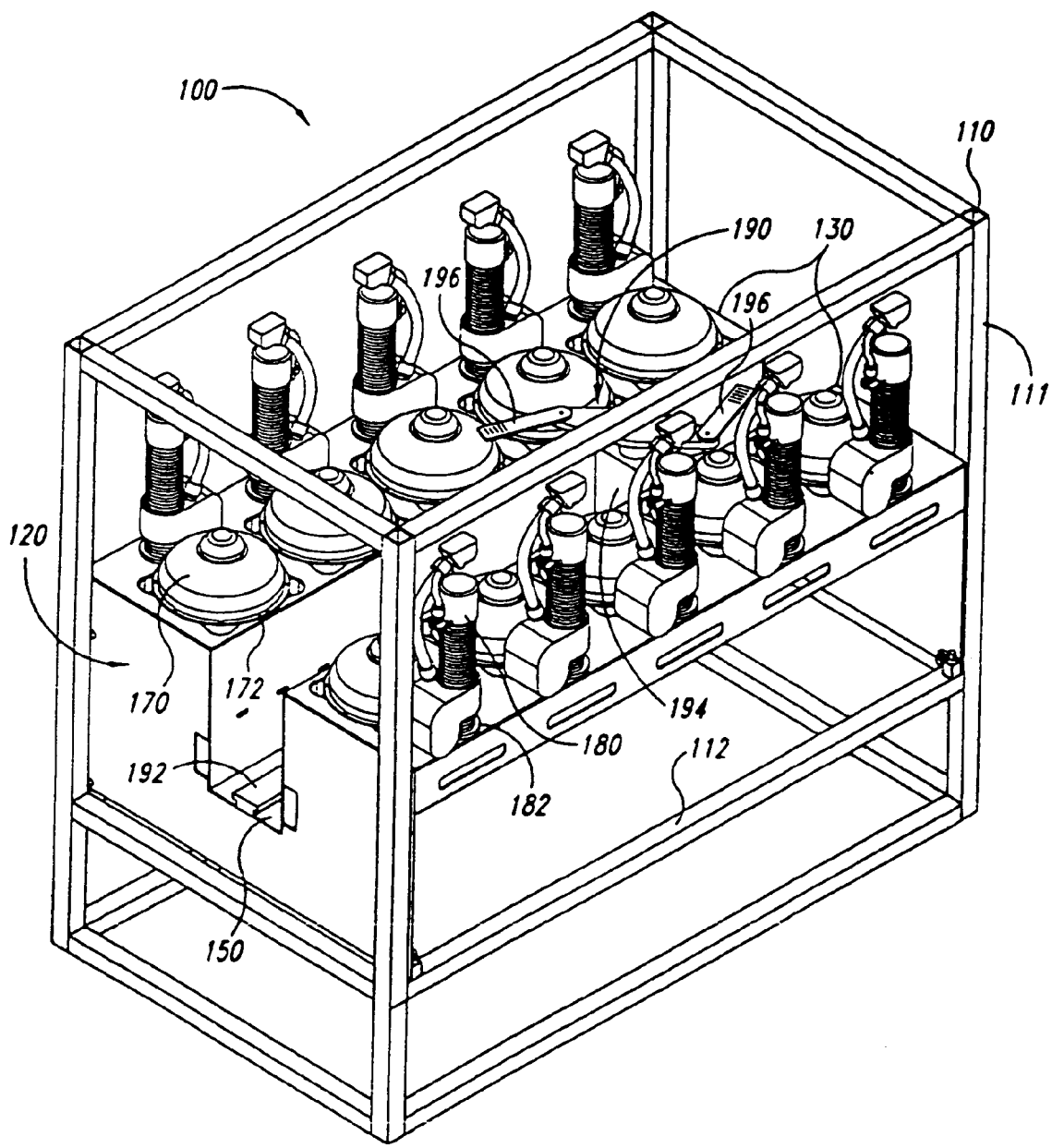
FIG. 2A is an isometric view illustrating a portion of a wet chemical processing tool in accordance with one embodiment of the invention.

FIG. 2A is an isometric view showing a portion of an integrated tool 100 in accordance with an embodiment of the invention. In this embodiment, the integrated tool 100 includes a frame 110, a dimensionally stable mounting module 120 mounted to the frame 110, a plurality of wet chemical processing chambers 170, and a plurality of lift-rotate units 180. The tool 100 can also include a transport system 190. The mounting module 120 carries the processing chambers 170, the lift-rotate units 180, and the transport system 190.

The frame 110 has a plurality of posts 111 and cross-bars 112 that are welded together in a manner known in the art. A plurality of outer panels and doors (not shown in FIG. 2A) are generally attached to the frame 110 to form an enclosed cabinet. The mounting module 120 is at least partially housed within the frame 110. In one embodiment, the mounting module 120 is carried by the cross-bars 112 of the frame 110, but the mounting module 120 can stand directly on the floor of the facility or other structures in other embodiments.

The mounting module 120 is a rigid, stable structure that maintains the relative positions between the wet chemical processing chambers 170, the lift-rotate units 180, and the transport system 190. One aspect of the mounting module 120 is that it is much more rigid and has a significantly greater structural integrity compared to the frame 110 so that the relative positions between the wet chemical processing chambers 170, the lift-rotate units 180, and the transport system 190 do not change over time. Another aspect of the mounting module 120 is that it includes a dimensionally stable deck 130 with positioning elements at precise locations for positioning the processing chambers 130 and the lift-rotate units 180 at known locations on the deck 130. In one embodiment (not shown), the transport system 190 can be mounted directly to the deck 130. In other embodiments, the mounting module 120 also has a dimensionally stable platform 150 and the transport system 190 is mounted to the platform 150. The deck 130 and the platform 150 are fixedly positioned relative to each other so that positioning elements on the deck 130 and positioning elements on the platform 150 do not move relative to each other. The mounting module 120 accordingly provides a system in which wet chemical processing chambers 170 and lift-rotate units 180 can be removed and replaced with interchangeable components in a manner that accurately positions the replacement components at precise locations on the deck 130.

The tool 100 is particularly suitable for applications that have demanding specifications which require frequent maintenance of the wet chemical processing chambers 170, the lift-rotate units 180, or the transport system 190. A wet chemical processing chamber 170 can be repaired or maintained by simply detaching the chamber from the processing deck 130 and replacing the chamber 170 with an interchangeable chamber having mounting hardware configured to interface with the positioning elements on the deck 130. Because the mounting module 120 is dimensionally stable and the mounting hardware of the replacement processing chamber 170 interfaces with the deck 130, the chambers 170 can be interchanged on the deck 130 without having to recalibrate the transport system 190. This is expected to significantly reduce the downtime associated with repairing or maintaining processing chambers 170 so that the tool can maintain a high throughput in applications that have stringent performance specifications.

FIG. 2B is a top plan view of the tool 100 illustrating the transport system 190 and a load/unload module 198 attached to the mounting module 120. Referring to FIGS. 2A and 2B together, the transport system 190 includes a track 192 and a robot 193 (FIG. 2B). The track 192 is mounted to the platform 150 in the embodiment shown in FIGS. 2A and 2B. More specifically, the track 192 interfaces with positioning elements on the platform 150 to accurately position the track 192 relative to the chambers 170 and the lift-rotate units 180 attached to the deck 130. The robot 193 can include a base unit 194 that moves linearly along the track 192, an arm assembly 195 carried by the base unit 194, and end-effectors 196 rotatably carried by the arm assembly 195. The arm assembly 195 rotates and moves along an elevation axis to position the end-effectors 196 at the chambers 170 and cassettes in the load/unload module 198. The robot 193 and end-effectors 196 can accordingly move in a fixed, dimensionally stable reference frame established by the mounting module 120. Referring to FIG. 2B, the tool 100 can further include a plurality of panels 199 attached to the frame 110 to enclose the mounting module 120, the wet chemical processing chambers 170, the lift-rotate units 180, and the transport system 190 in a cabinet. In other embodiments, the panels 199 on one or both sides of the tool 100 can be removed in the region above the processing deck 130 to provide an open tool.

B. Embodiments of Dimensionally Stable Mounting Modules

Figure 3:
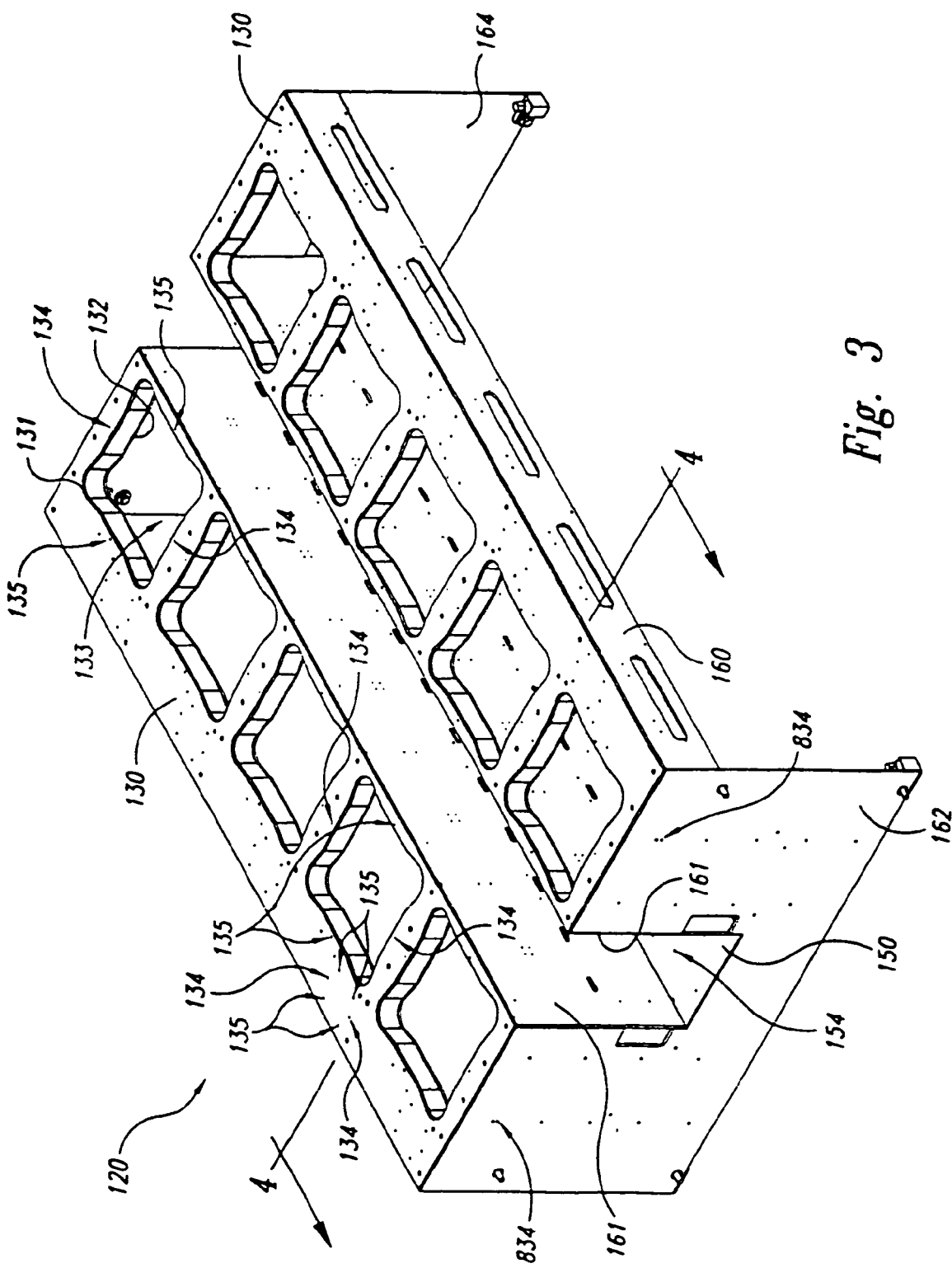
FIG. 3 is an isometric view of a mounting module for use in a wet chemical processing tool in accordance with an embodiment of the invention.

FIG. 3 is an isometric view of a mounting module 120 in accordance with an embodiment of the invention for use in the tool 100. In this embodiment, the deck 130 includes a rigid first panel 131 and a rigid second panel 132 superimposed underneath the first panel 131. The first panel 131 can be an outer member and the second panel 132 can be an interior member juxtaposed to the outer member. The first and second panels 131 and 132 can also have different configurations than the embodiment shown in FIG. 3. A plurality of chamber receptacles 133 are disposed in the first and second panels 131 and 132 to receive the wet chemical processing chambers 170 (FIG. 2A).

The deck 130 can further include a plurality of positioning elements 134 and attachment elements 135 arranged in a precise pattern across the first panel 131. The positioning elements 134 can be holes machined in the first panel 131 at precise locations and/or dowels or pins received in the holes. The dowels are also configured to interface with the wet chemical processing chambers 170 (FIG. 2A). In other embodiments, the positioning elements 134 can be pins, such as cylindrical pins or conical pins, that project upwardly from the first panel 131 without being positioned in holes in the first panel 131. The deck 130 has a first set of positioning elements 134 located at each chamber receptacle 133 to accurately position the individual wet chemical processing chambers at precise locations on the mounting module 120. The deck 130 can also include a second set of positioning elements 134 near each receptacle 133 to accurately position individual lift-rotate units 180 at precise locations on the mounting module 120. The attachment elements 135 can be threaded holes in the first panel 131 that receive bolts to secure the chambers 170 and the lift-rotate units 180 to the deck 130.

The mounting module 120 also includes exterior side plates 160 along longitudinal outer edges of the deck 130, interior side plates 161 along longitudinal inner edges of the deck 130, and endplates 162 and 164 attached to the ends of the deck 130. The transport platform 150 is attached to the interior side plates 161 and the end plates 162 and 164. The transport platform 150 includes positioning elements 152 for accurately positioning the track 192 (FIGS. 2A and 2B) of the transport system 190 on the mounting module 120. The transport platform 150 can further include attachment elements, such as tapped holes, that receive bolts to secure the track 192 to the platform 150.

Figure 4:
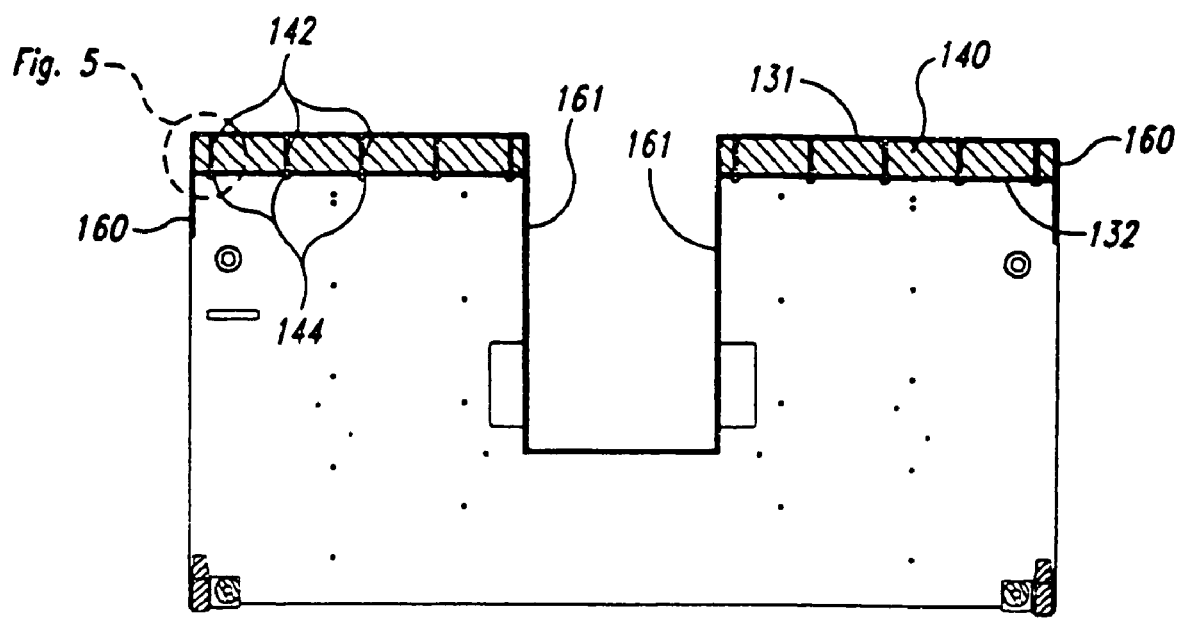
FIG. 4 is a cross-sectional view along line 4-4 of FIG. 3 of a mounting module for use in a wet chemical processing tool in accordance with an embodiment of the invention.
Figure 5:
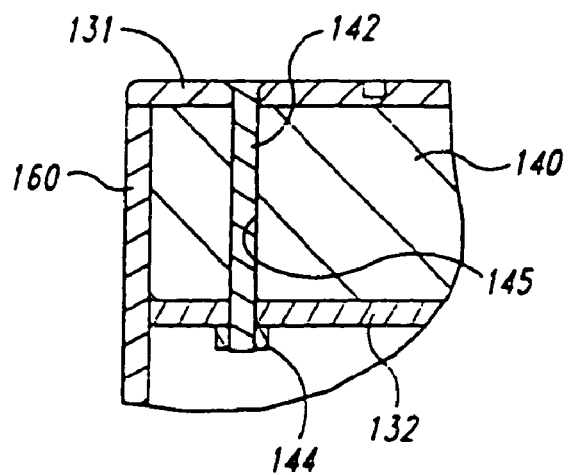
FIG. 5 is a cross-sectional view showing a portion of a deck of a mounting module in greater detail.

FIG. 4 is a cross-sectional view illustrating one suitable embodiment of the internal structure of the deck 130, and FIG. 5 is a detailed view of a portion of the deck shown in FIG. 4. In this embodiment, the deck 130 includes bracing 140, such as joists, extending laterally between the exterior side plates 160 and the interior side plates 161. The first panel 131 is attached to the upper side of the bracing 140, and the second panel 132 is attached to the lower side of the bracing 140. The deck 130 can further include a plurality of throughbolts 142 and nuts 144 that secure the first and second panels 131 and 132 to the bracing 140. As best shown in FIG. 5, the bracing 140 has a plurality of holes 145 through which the throughbolts 142 extend. The nuts 144 can be welded to the bolts 142 to enhance the connection between these components.

The panels and bracing of the deck 130 can be made from stainless steel, other metal alloys, solid cast materials, or fiber-reinforced composites. For example, the panels and plates can be made from Nitronic 50 stainless steel, Hastelloy 625 steel alloys, or a solid cast epoxy filled with mica. The fiber-reinforced composites can include a carbon-fiber or Kevlar® mesh in a hardened resin. The material for the panels 131 and 132 should be highly rigid and compatible with the chemicals used in the wet chemical processes. Stainless steel is well-suited for many applications because it is strong but not affected by many of the electrolytic solutions or cleaning solutions used in wet chemical processes. In one embodiment, the panels and plates 131, 132, 160, 161, 162 and 164 are 0.125 to 0.375 inch thick stainless steel, and more specifically they can be 0.250 inch thick stainless steel. The panels and plates, however, can have different thickness in other embodiments.

The bracing 140 can also be stainless steel, fiber-reinforced composite materials, other metal alloys, and/or solid cast materials. In one embodiment, the bracing can be 0.5 to 2.0 inch wide stainless steel joists, and more specifically 1.0 inch wide by 2.0 inches tall stainless steel joists. In other embodiments the bracing 140 can be a honey-comb core or other structures made from metal (e.g., stainless steel, aluminum, titanium, etc.), polymers, fiber glass or other materials.

The mounting module 120 is constructed by assembling the sections of the deck 130, and then welding or otherwise adhering the end plates 162 and 164 to the sections of the deck 130. The components of the deck 130 are generally secured together by the throughbolts 142 without welds. The outer side plates 160 and the interior side plates 161 are attached to the deck 130 and the end plates 162 and 164 using welds and/or fasteners. The platform 150 is then securely attached to the end plates 162 and 164, and the interior side plates 161. The order in which the mounting module 120 is assembled can have several different embodiments and is not limited to the procedure explained above.

The mounting module 120 provides a heavy-duty, dimensionally stable structure that maintains the relative positions between the positioning elements 134 on the deck 130 and the positioning elements 152 on the platform 150 within a range that does not require the transport system 190 to be recalibrated each time a replacement processing chamber 170 or lift-rotate unit 180 is mounted to the deck 130. The mounting module 120 is generally a rigid structure that is sufficiently strong to maintain the relative positions between the positioning elements 134 and 152 when the wet chemical processing chambers 170, the lift-rotate units 180, and the transport system 190 are mounted to the mounting module 120. In several embodiments, the mounting module 120 is configured to maintain the relative positions between the positioning elements 134 and 152 to within 0.025 inch. In other embodiments, the mounting module is configured to maintain the relative positions between the positioning elements 134 and 152 to within approximately 0.005 to 0.015 inch. As such, the deck 130 often maintains a uniformly flat surface to within approximately 0.025 inch, and in more specific embodiments to approximately 0.005-0.015 inch.

C. Embodiments of Wet Chemical Processing Chambers

Figure 6:
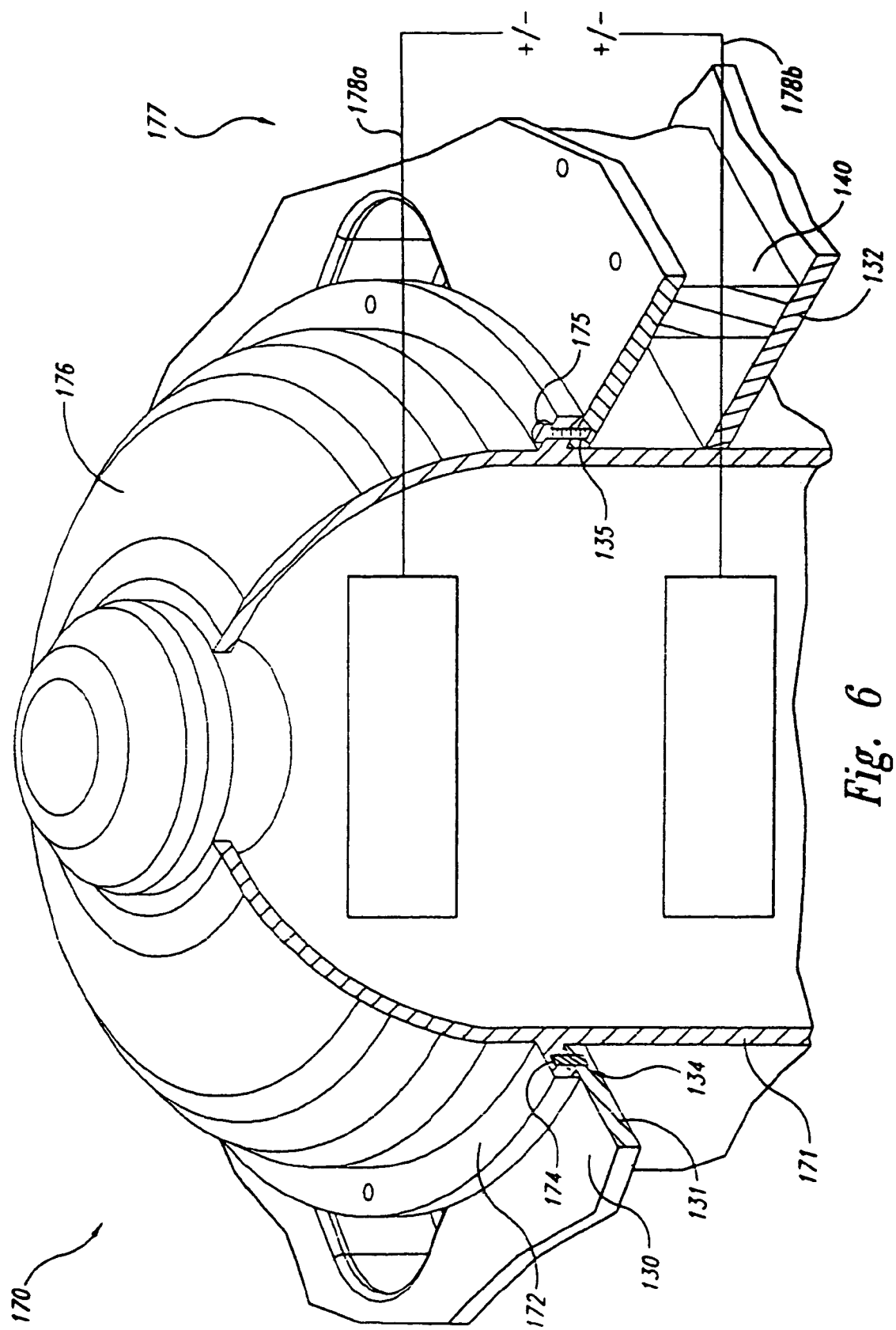
FIG. 6 is a cross-sectional isometric view schematically illustrating an electrochemical deposition chamber for use in the wet chemical processing tool in accordance with an embodiment of the invention.

FIG. 6 is an isometric cross-sectional view showing the interface between a wet chemical processing chamber 170 and the deck 130. The chamber 170 can include a processing vessel 171 and a collar 172. The processing vessel 171 can be formed from a polymeric material or other material that is compatible with the chemicals used in the wet chemical process. In many applications, the processing vessel 171 is composed of a high density polymer that does not react with the electrolytic solution, cleaning solution, or other type of fluid used in the chamber 170. The collar 172 and the vessel 171 can be separate components that are connected together. In such cases, the collar 172 can be made from a dimensionally stable material, such as stainless steel, fiber-reinforced materials, steel alloys, cast solid materials, or other suitably rigid materials. In other embodiments, the collar 172 is integral with the vessel 171 and formed from a high-density polymer or other suitable material.

The collar 172 includes a plurality of interface members 174 that are arranged in a pattern to be aligned with the positioning elements 134 on the deck 130. The positioning elements 134 and the interface members 174 are also configured to mate with one another to precisely position the collar 172, and thus the chamber 170, at a desired operating location on the deck 130 to work with lift-rotate unit 180 and the transport system 190. The positioning elements 134 can be a set of precisely machined holes in the deck 130 and dowels received in the holes, and the interface members 174 can be holes precisely machined in the collar 172 to mate with the dowels. The dowels can be pins with cylindrical, spherical, conical or other suitable shapes to align and position the collar 172 at a precise location relative to the deck 130. The collar 172 can further include a plurality of fasteners 175 arranged to be aligned with the attachment elements 135 in the deck 130. The fasteners 175 can be bolts or other threaded members that securely engage the attachment elements 135 to secure the collar 172 to the deck 130. The collar 172 accordingly holds the processing vessel 171 at a fixed; precise location on the deck.

The wet chemical processing chambers 170 can be electrochemical deposition chambers, spin-rinse-dry chambers, cleaning capsules, etching chambers, or other suitable wet chemical processing stations. The chamber 170 illustrated in FIG. 6 is an electrochemical deposition chamber having a head 176 with a workpiece holder to position a workpiece in the vessel 171. The chamber 170 shown in FIG. 6 also has an electrical system 177 having a first electrode 178a configured to contact the workpiece and a second electrode 178b disposed in the vessel 171. The first and second electrodes 178a and 178b establish an electrical field to plate ions in an electrolytic solution onto the workpiece. It will be appreciated that the electrochemical processing chamber 170 can be an electroless chamber that does not include the electrical system 177. Suitable electrochemical deposition chambers are disclosed in U.S. application Ser. Nos. 09/804,696; 09/804,697; 10/234,637; 10/234,982; 10/234,628; 10/234,442; 09/849,505; 09/866,391; 09/866,463; 09/875,365; 09/872,151; and 10/295,302, all of which are herein incorporated by reference in their entirety. In other embodiments, the wet chemical processing chambers can be capsules or other types of chambers for cleaning wafers, such as those shown in U.S. Pat. Nos. 6,350,319; 6,423,642; and 6,413,436, all of which are also herein incorporated by reference in their entirety.

The tool 100 can include various combinations of wet chemical processing chambers 170. For example, all of the chambers can be of a common type (e.g., electrochemical deposition chambers, cleaning chambers, etching chambers, etc.), or various combinations of different types of chambers can be mounted to the deck 130 of the tool 100. Suitable combinations of wet chemical processing chambers 170 and workpiece transport systems 190 are disclosed in the references incorporated above and U.S. patent Ser. Nos. 09/875, 300; 09/875,428; and 10/080,910, all of which are herein incorporated by reference.

D. Embodiments of Lift Rotate Units and Load/Unload Modules

Figure 7:
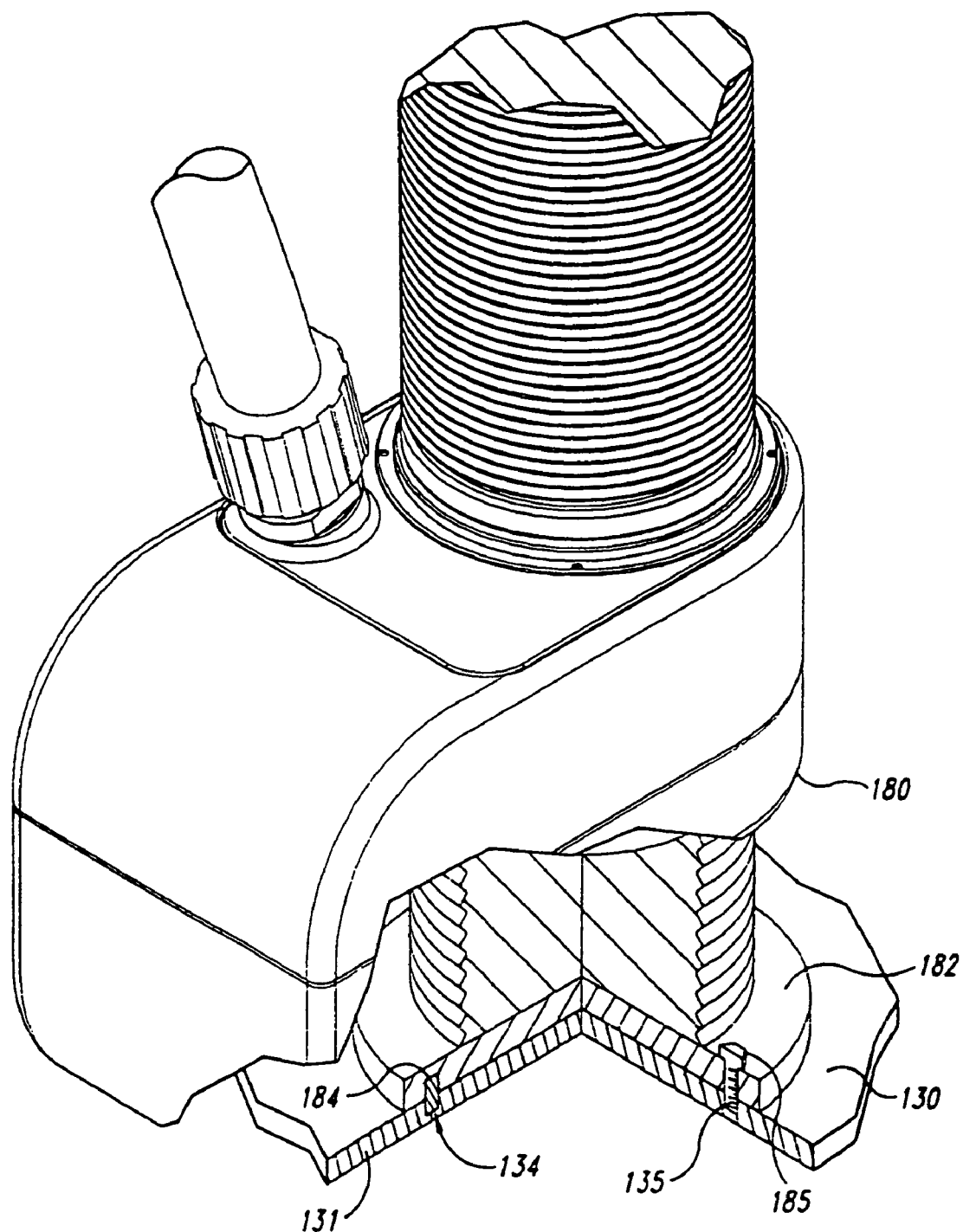
FIG. 7 is a cross-sectional isometric view of a lift-rotate unit for operating the head of wet chemical processing chambers in accordance with an embodiment of the invention.

FIG. 7 is an isometric cross-sectional view showing an embodiment of a lift-rotate unit 180 attached to the deck 130. In this embodiment, the lift-rotate unit 180 includes a dimensionally stable collar 182. The collar 182 includes a plurality of interface members 174 arranged in a pattern to be aligned with the positioning elements 134 when the lift-rotate unit 180 is positioned at the desired location for operating the head 176 of the chamber 170 (FIG. 6). The lift-rotate unit 180 can further include a plurality of fasteners 185 arranged in the collar 182 to be aligned with attachment elements 135 in the deck 130 for mounting the lift-rotate unit 180 to the mounting module 120. The interface elements 184, positioning elements 134, fasteners 185, and attachment elements 135 can have similar or identical structures as described above with reference to FIG. 6.

Figure 8:
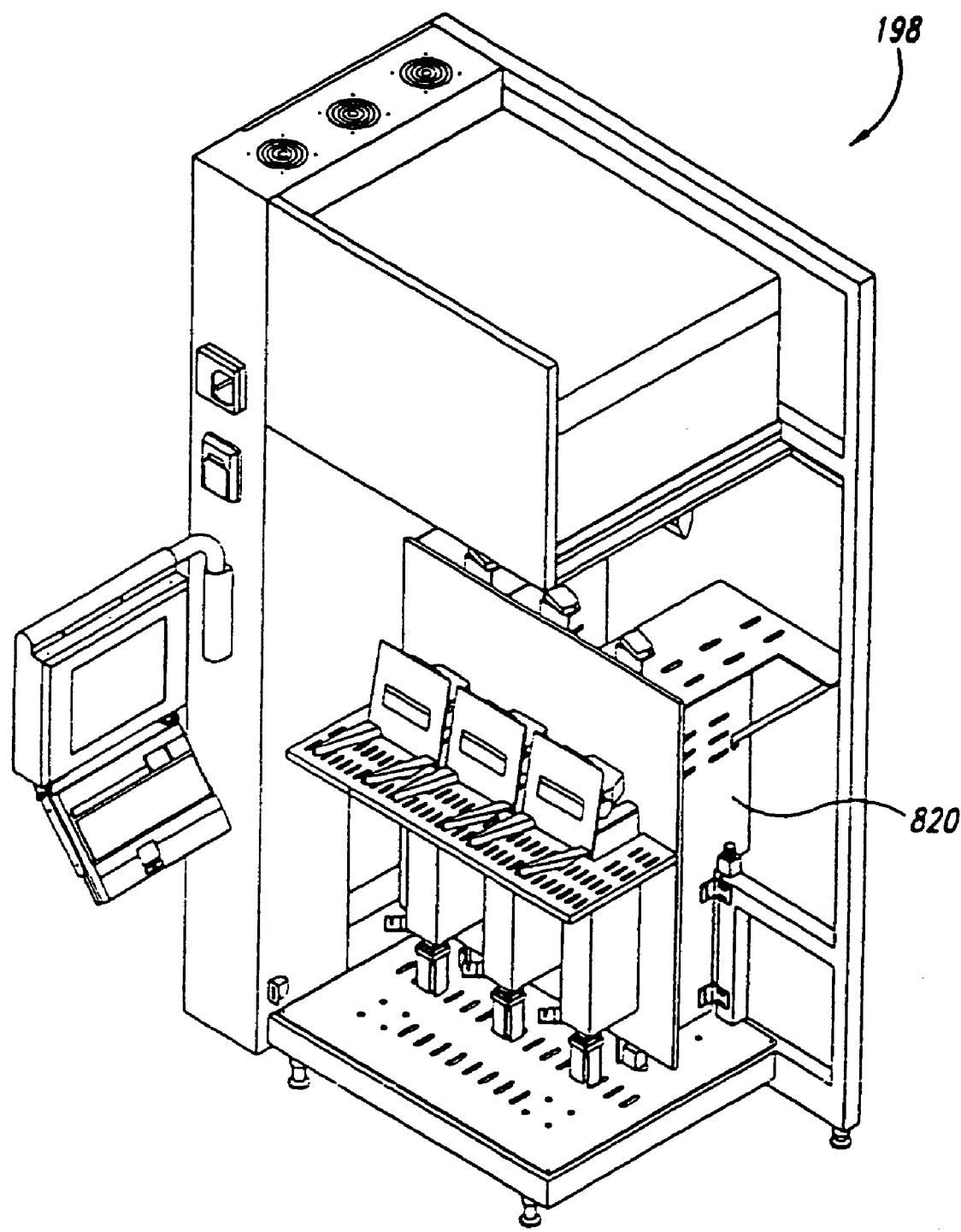
FIG. 8 is an isometric view of a loading/unloading module for use with the mounting module in accordance with an embodiment of the invention.

FIG. 8 is an isometric view of the load/unload module 198 for holding workpieces before and after being processed in the chambers 170. The load/unload module 198 has a dimensionally stable structure 820 that can be formed from stainless steel, other steel alloys, or other highly dimensionally stable materials in a manner similar to the mounting module 120 described above. Referring to FIGS. 3 and 8 together, the structure 820 can include interface members (not shown) arranged to be aligned with precision elements 834 (FIG. 3) on the end plate 162 of the mounting module 120 when the load/unload module 198 is properly positioned for operation. The structures of the interface members on the structure 820 and the positioning elements 834 on the end plate 162 can be similar to those described above with reference to FIG. 6. The load/unload module 198 can accordingly be positioned accurately relative to the transport system 190 without having to recalibrate the transport system 190 each time the load/unload module 198 is attached to the tool 100.

E. Systems and Methods for Automated Robot Calibration

Figure 9:
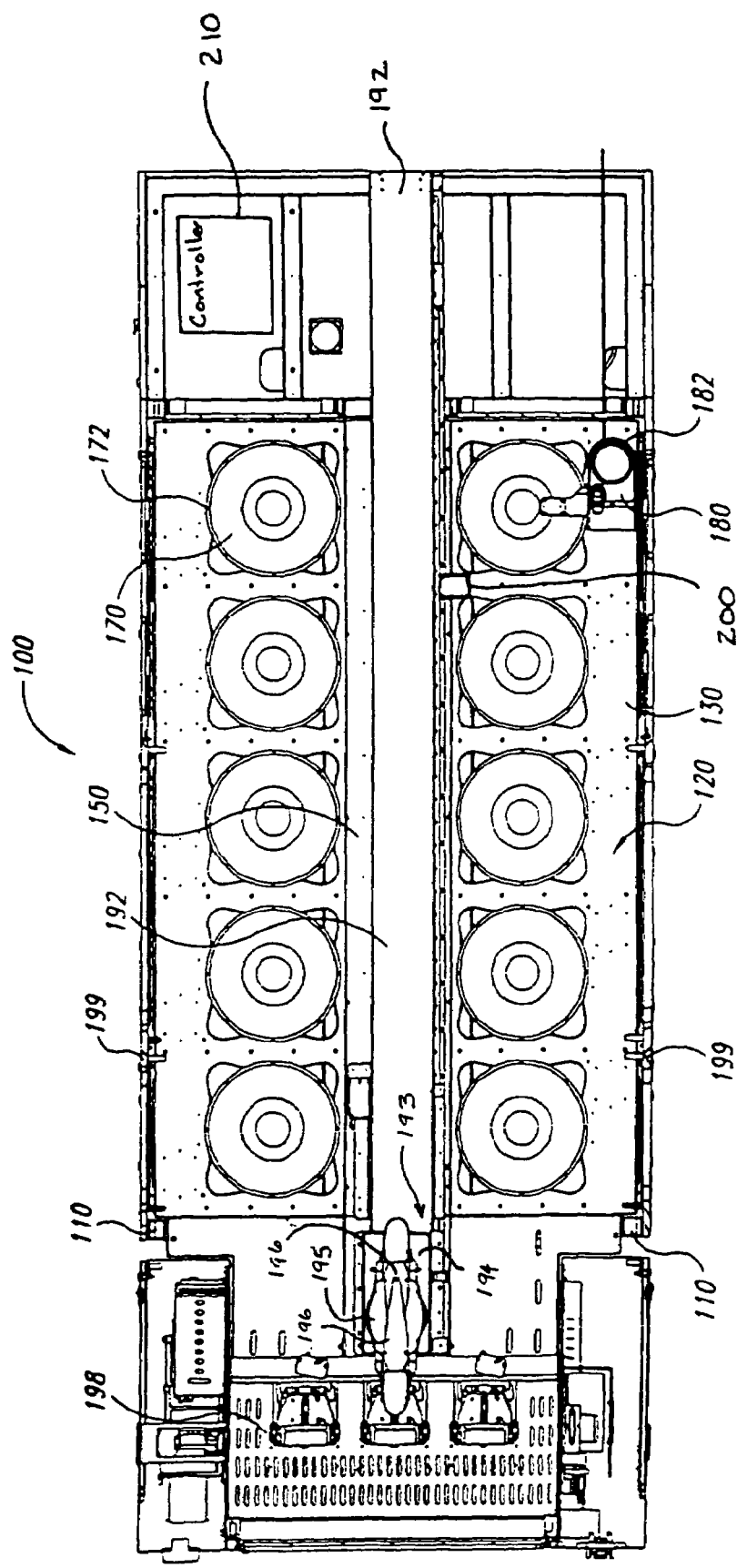
FIG. 9 is a top plan view of a wet chemical processing tool having an automated calibration system in accordance with an embodiment of the invention.

Another aspect of the present invention, as shown in FIG. 9, is directed toward systems and methods for automatically calibrating the transport system 190 to a reference frame of the tool 100. The calibration systems quickly position arm unit 195 and the end-effectors 196 in a desired "zero" or origin position with respect to the axis of the track 192 or another axis of the reference frame. The calibration systems can also determine an axial origin position of the base 194 with respect to the track 192 and an elevation origin position of the arm assembly 195. Several embodiments of calibration systems in accordance with this aspect of the invention are particularly efficacious when used with the mounting module 120 because this combination of features enables methods that automatically calibrate/align the transport system 190 to operate with the processing chambers 170 without manually teaching the robot 193 the position of each chamber 170. As such, several methods in accordance with this aspect of the invention are expected to reduce the time to calibrate the transport system 190 to operate with the processing chambers 170 and the load/unload module 198 to only a few minutes instead of several hours.

The embodiment of the calibration system shown in FIG. 9 includes a sensor unit 200 (shown schematically) and a controller 210 (shown schematically). The sensor unit 200 is attached to the deck 130 or another portion of the mounting module 120 at a known location with respect to the reference frame of the tool 100. In one embodiment, the reference frame of the tool 100 has a first reference axis extending along a center line of the track 192, a second reference axis orthogonal to the first reference axis, and a third reference axis orthogonal to both the first and second reference axes. The sensor unit 200 is positioned at a precise location on the mounting module 120 by interconnecting a positioning element on the sensor unit 200 with a positioning element on the mounting module 120. When the positioning elements are interconnected, the sensor unit 200 is positioned at a known location in the three-dimensional navigational volume of the reference frame defined by the mounting module 120.

The controller 210 can be a computer. The controller 210 can be coupled to the sensor unit 200 and the robot 193 to control the movement of the robot during calibration as well as operation. The controller 210 can be the same computer that operates the chambers 170, the lift-rotate units 180, and the load/unload module 198, but in other embodiments the controller 210 can be a separate computer that interfaces with other computers in the tool 100. The controller 210 includes a computer operable medium, such as software and/or hardware, that contains instructions to perform embodiments of calibration methods in accordance with the invention.

Figure 10:
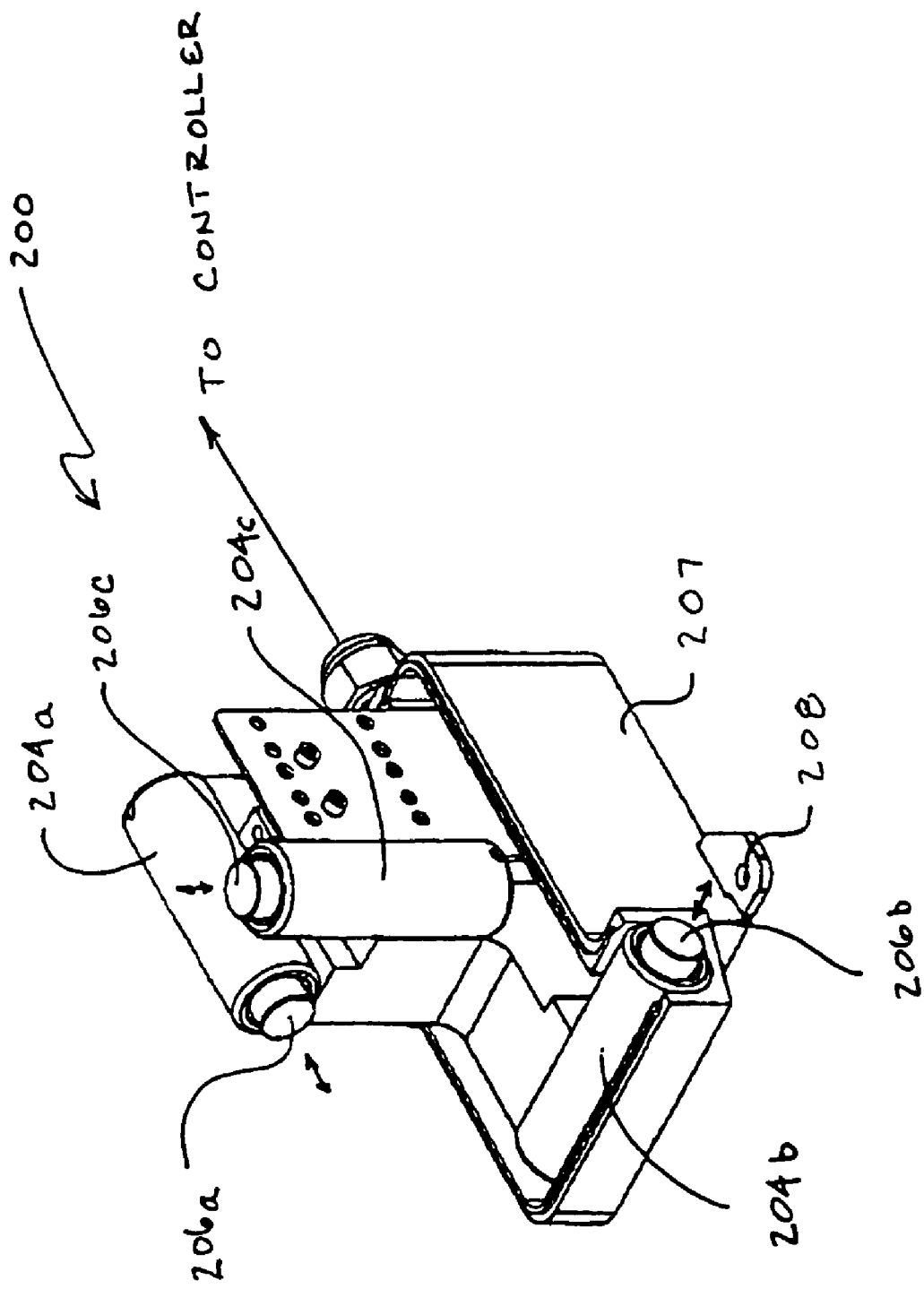
FIG. 10 is an isometric view of a sensor unit for use in an automated calibration system in accordance with an embodiment of the invention.

FIG. 10 is an isometric view showing an embodiment of the sensor unit 200. In this embodiment, the sensor unit 200 includes a plurality of sensors 204 (identified individually by reference numbers 204a-c). The sensors 204a-c can be arranged along three orthogonal axes corresponding to the first-third reference axes of the reference frame. This embodiment of the sensor unit 200 more specifically includes a first sensor 204a parallel to a first reference axis that coincides with the center line of the track 192 (FIG. 9), a second sensor 204b defining a rotation sensor, and a third sensor 204c defining an elevation sensor. The sensors 204 can be linear displacement transducers having spring-loaded displacement members 206 (identified individually by reference numbers 206a-c). The displacement members 206 produce an electrical signal corresponding to the extent of linear displacement.

The sensors 204 can be mounted to a frame 207 that has at least one positioning and/or attachment element 208. The frame 207 is constructed to properly align the sensors 204 along the three reference axes, and the element 208 can be configured to precisely locate the frame 207 relative to a known location on the mounting module 120.

The sensor unit 200 can have other embodiments that are different than the embodiment shown in FIG. 10. For example, the sensor unit 200 can have only a single sensor, or any number of sensors. The sensors also do not need to be arranged along three orthogonal axes. The sensor unit 200 can also have other types of sensors that measure angular displacement or indicate contact without indicating any displacement.

Figure 11:
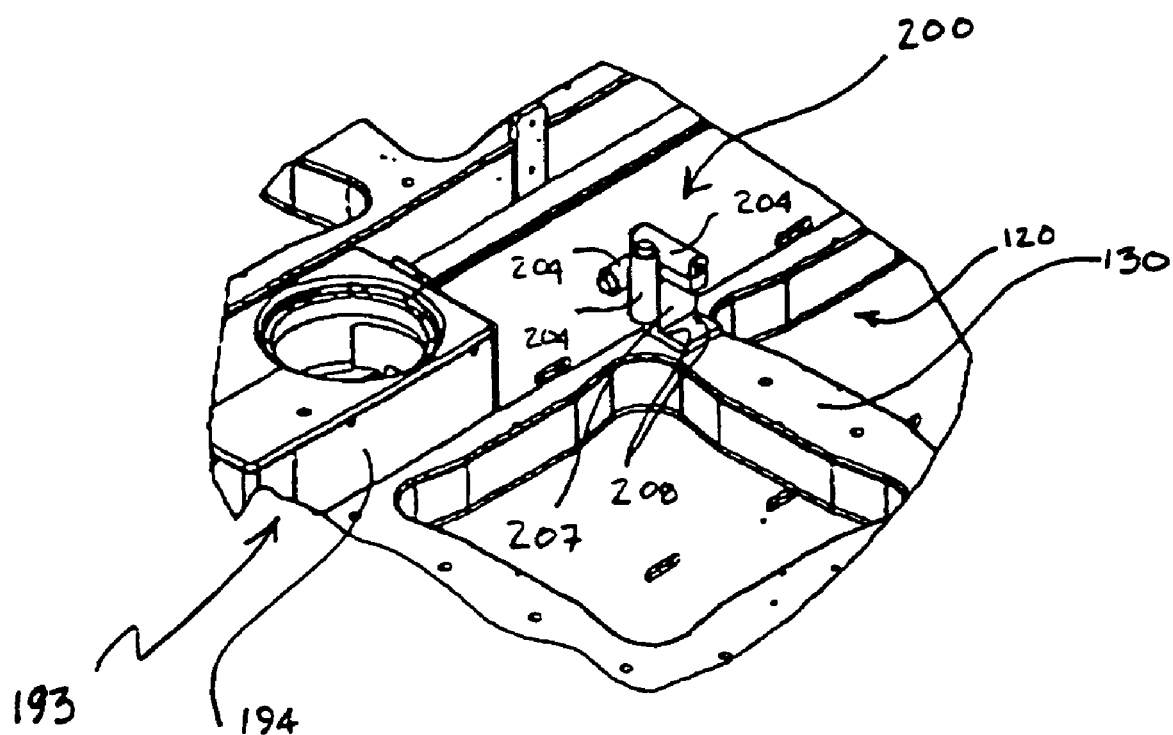
FIG. 11 is an isometric view of a sensor unit attached to a mounting module in accordance with an embodiment of the invention.

FIG. 11 is an isometric view of the embodiment of the sensor unit 200 shown in FIG. 10 mounted to the deck 130 of the tool 100. In this embodiment, the positioning/attachment elements 208 interface with corresponding positioning/attachment elements on the deck 130 to position the frame 207 at a precise location with respect to the mounting module 120. The sensors 204 are positioned proximate to the region of the track to interface with the robot 193. For purposes of clarity, only the base unit 194 of the robot 193 is shown in FIG. 11, but it will be appreciated that the arm assembly 195 is received in the large annular opening of the base unit 194 and chambers 170 are attached to the mounting module 120.

Figure 12:
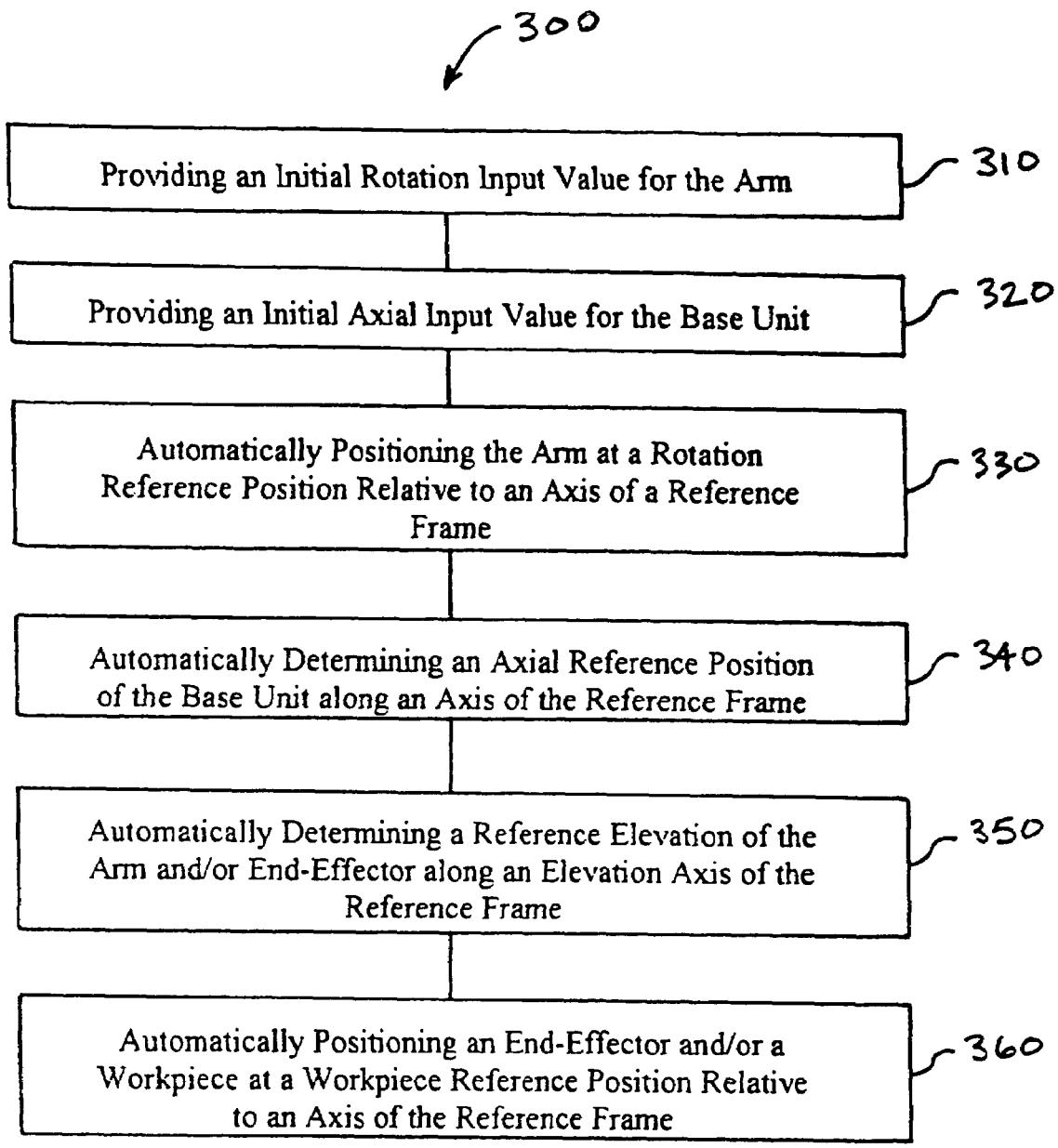
FIG. 12 is a flow chart of a method for automatically calibrating a robot of a transport system to a reference frame in accordance with an embodiment of the invention.

FIG. 12 is a flow chart illustrating a method 300 for calibrating the transport system 190 to the mounting module 120 in accordance with an embodiment of the invention. The calibration method 300 shown in FIG. 12 includes several different procedures. It will be appreciated, however, that not all of the procedures shown in FIG. 12 are necessary for several other embodiments of calibration methods in accordance with the invention.

The calibration method 300 includes an arm input procedure 310 for inputting a value to the controller 210 corresponding to the rotational position of the arm relative to the first axis of the reference frame. In one embodiment, the arm input procedure 310 provides an input value based on an estimated alignment of an arm axis along the arm with a first reference axis along the track 192.

Figure 13A:
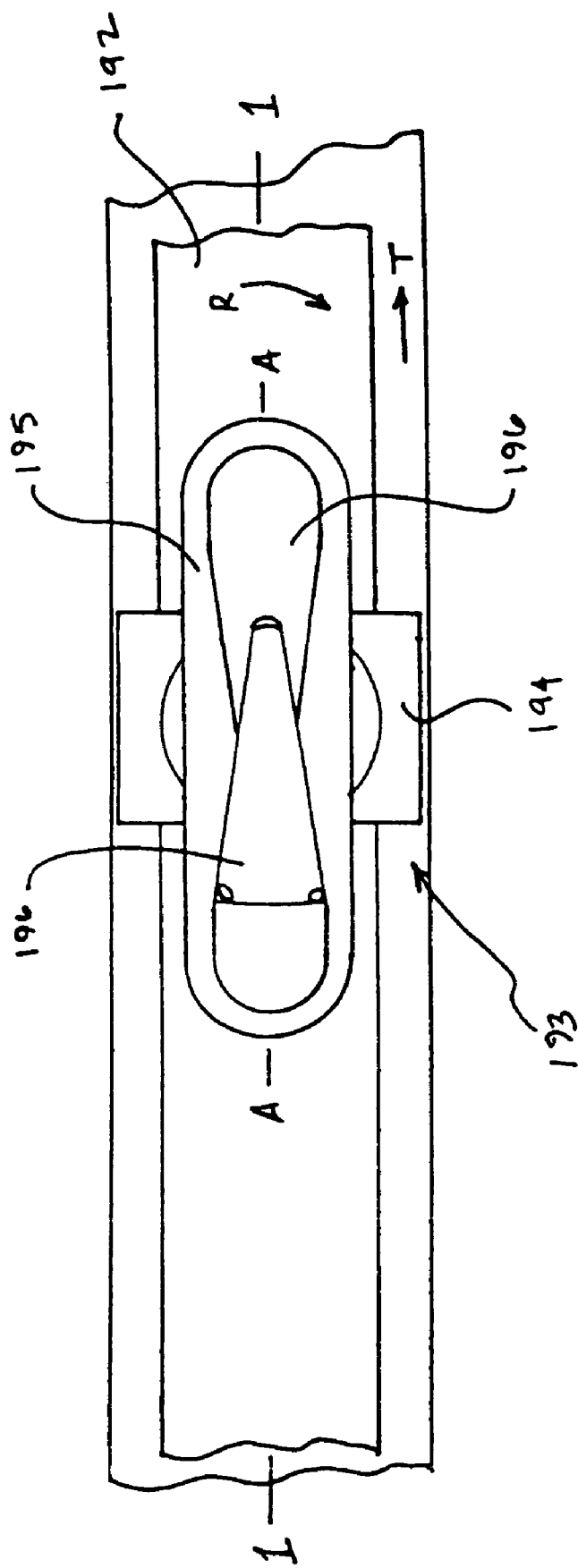
FIGS. 13A and 13B are top plan views illustrating specific stages of a method for calibrating a transport system in accordance with an embodiment of the invention.

Referring to FIG. 13A, the arm input procedure 310 can include manually rotating the arm 195 to align an arm axis A-A of the arm 195 with the first reference axis 1-1. Although an operator can generally come fairly close to aligning the arm axis A-A to the first reference axis 1-1 by visually "eye-balling" the position of the arm 195 relative to the track 192, there is typically a slight offset between the arm axis and the first reference axis. It will be appreciated that optical sensors or other types of indicia can also be used to initially align the arm 195 with the first reference axis 1-1.

After aligning the arm 195 with the first reference axis 1-1, the operator actuates a button on the tool 100 to input the encoder value of the rotational position of the arm 195. The button can be an external button on the tool 100 or a screen display button on a display screen associated with the computer operable medium of the controller 210 that runs the method 300. The initial rotational input value is accordingly an initial approximation of the reference position of the arm axis A-A.

Figure 13B:
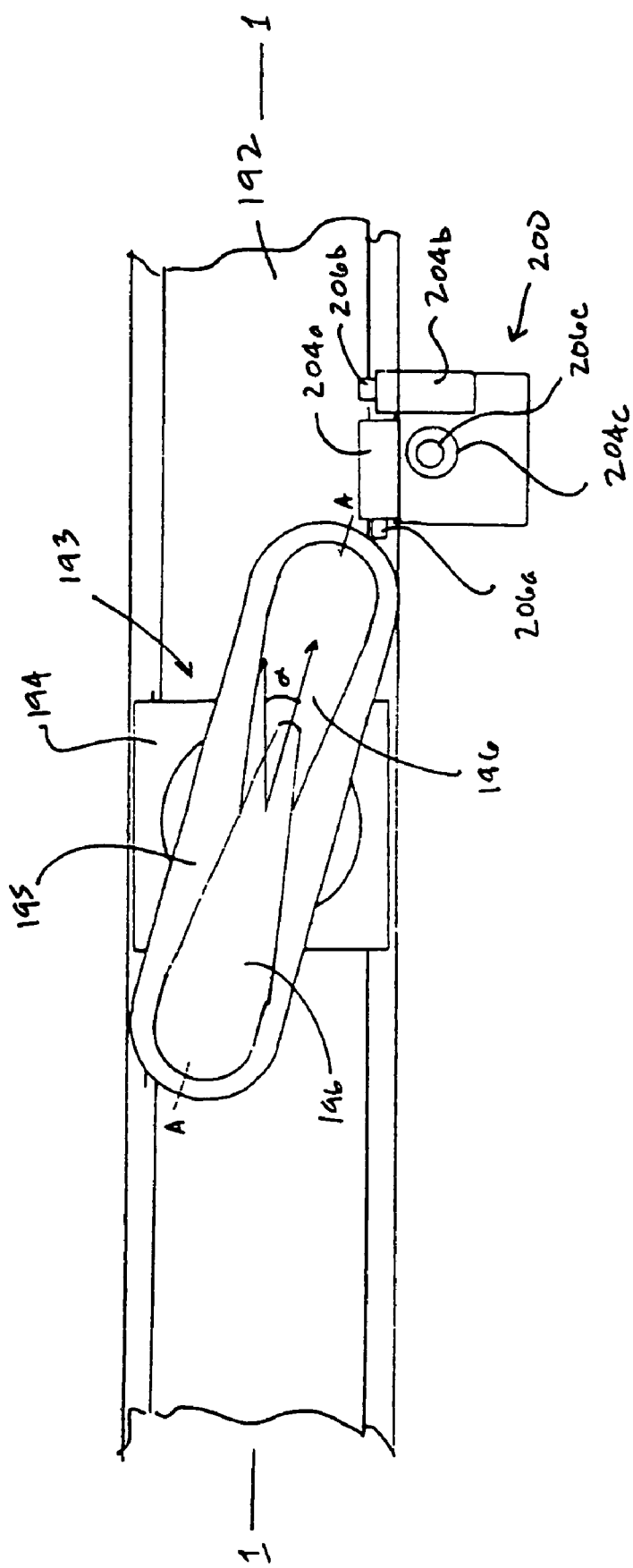

Referring again to FIG. 12, the method 300 also includes a base input procedure 320 that provides an initial input value of the axial position of the base along the track. Referring to FIG. 13A, the base input procedure includes rotating the arm 195 (arrow R) and translating the base 194 along the track 192 (arrow T). Referring to FIG. 13B, the arm 195 is rotated with respect to the track 192 and the base 194 is translated along the track 192 until a distal portion of the arm 195 contacts the displacement member 206a of the first sensor 204a. The displacement of the displacement member 206a causes the first sensor 204a to send a signal to the controller 210. The angle of the arm is determined by the controller 210 using the rotational input value of the arm from the arm input procedure 310 and the encoder value of the position of the arm 195 in FIG. 13B. The controller 210 can then calculate the position of the base 194 along the track 192 based on the angle α and the signal from the sensor 204a. The encoder value for the base 194 at this position can accordingly define an initial axial reference value for the base 194 along the first axis 1-1 of the reference frame.

The actual axial position of the base 194 along the track 192 may be slightly different than the calculated position because the arm 195 may not have been aligned accurately with the first reference axis 1-1 in the procedure 310. The additional procedures of the method 300 can automatically position the arm in better alignment with the first reference axis 1-1 and determine the actual axial location of the base along the first reference axis. Moreover, additional procedures of the method 300 can automatically determine the elevation of an end-effector with respect to the reference frame and automatically position an end-effector in alignment with respect to the first reference axis or another reference axis.

Referring to FIG. 12, the method 300 further includes an automated arm procedure 330 that refines the alignment of the arm axis A-A with the first reference axis 1-1. The automated arm procedure 330 can be controlled by the controller 210 based upon the initial rotational input value for the arm provided by the arm input procedure 310 and the initial axial input value for the base provided by the base input; procedure 320. Referring to FIG. 14A, the controller 210 causes the base 194 to translate along the track 192 until the base 194 reaches a first predetermined position $x_1$. The controller 210 then causes the arm 195 to rotate until it contacts and moves the second displacement member 206b of the second sensor 204b (i.e., rotational sensor). The movement of the displacement element 206b sends a signal to the controller 210. When the signal from the displacement member 206b reaches a predetermined value corresponding to a desired displacement, the controller 210 stops rotating the arm 195 and records an encoder value corresponding to the rotational position of the arm 195. The encoder value for the position of the arm 195 in FIG. 14A is compared with the encoder value for the initial rotational position of the arm provided by the arm input procedure 310, which is indicative of an angle $\beta_1$, corresponding to the angle between the arm axis A-A and the first reference axis 1-1.

The automated arm procedure 330 continues by translating the base 194 along the track 192 and performing a similar procedure with the opposite end of the arm 195. FIG. 14B shows this stage of the automated arm procedure 330. The controller 210 causes the base 194 to translate along the track 192 until the base reaches a second predetermined reference point $x_2$, and then the controller 210 causes the arm 195 to rotate until it depresses the second displacement member 206b by a predetermined value. The controller 210 accordingly notes the encoder value of the rotational position of the arm 195 corresponding to an angle $\beta_2$. Based upon the encoder values for the arm 195 at the position $\beta_1$, shown in FIG. 14A and the position $\beta_2$ shown in FIG. 14B, the controller 210 determines an arm offset value corresponding to the extent that the arm 195 was misaligned with the first reference axis 1-1 during the arm input procedure 310. The controller 210 then causes the arm 195 to rotate according to the offset value so that the arm axis A-A is aligned with the first axis 1-1.

Figure 15:
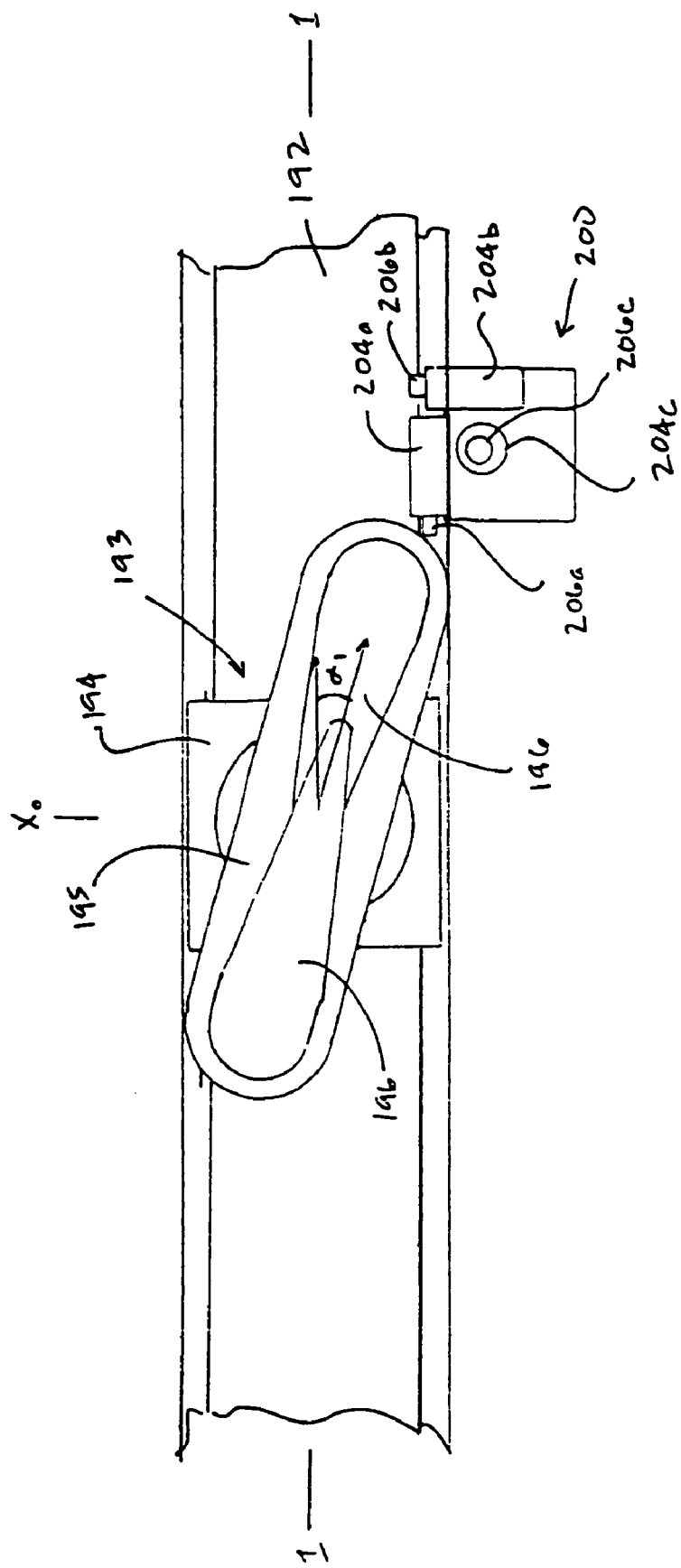
FIG. 15 is a top plan view of another stage for calibrating a robot of a transport system in accordance with an embodiment of the invention.

Referring to FIG. 12, the calibration method 300 can further include an automated base procedure 340 for refining the initial axial input value for the base along the first axis 1-1. Referring to FIG. 15, the controller 210 effectuates the automated base procedure 340 by rotating the arm 195 until it reaches an angle $\alpha_1$ and then translating the base 194 until the distal portion of the arm 195 displaces the first displacement member 206a by a predetermined distance. The angle $\alpha_1$ shown in FIG. 15 is an encoder value corresponding to a predetermined position for the arm during the automated base procedure 340. This encoder value is accurate because the automated arm procedure 330 eliminates or at least mitigates the error in positioning the arm 195 in alignment with the first reference axis 1-1 in the arm input procedure 310. The controller 210 accordingly records an axial origin encoder value of the base 194 at $x_0$ to refine the axial reference location of the base 194 along the track 192.

Referring again to FIG. 12, the method 300 can further include an automated elevation procedure 350 that determines a reference elevation of the arm and/or end-effector with respect to the reference frame. Referring back to FIG. 15, the controller 210 effectuates the automated elevation procedure 350 by raising the arm 195 so that it is above the third sensor 204c (i.e., the elevation sensor). The controller 210 then translates the base 194 along the track 192 and rotates the arm 195 beyond the angle $\alpha_1$ to position a reference surface on the under side of the arm 195 directly over the third sensor 204c. After the reference surface on the arm 195 is superimposed over the third sensor 204c, the controller 210 lowers the arm 195 until it displaces the third displacement element 206c by a predetermined distance and records an encoder value corresponding to the reference elevation of the arm 195 along an elevation axis.

Figure 16B:
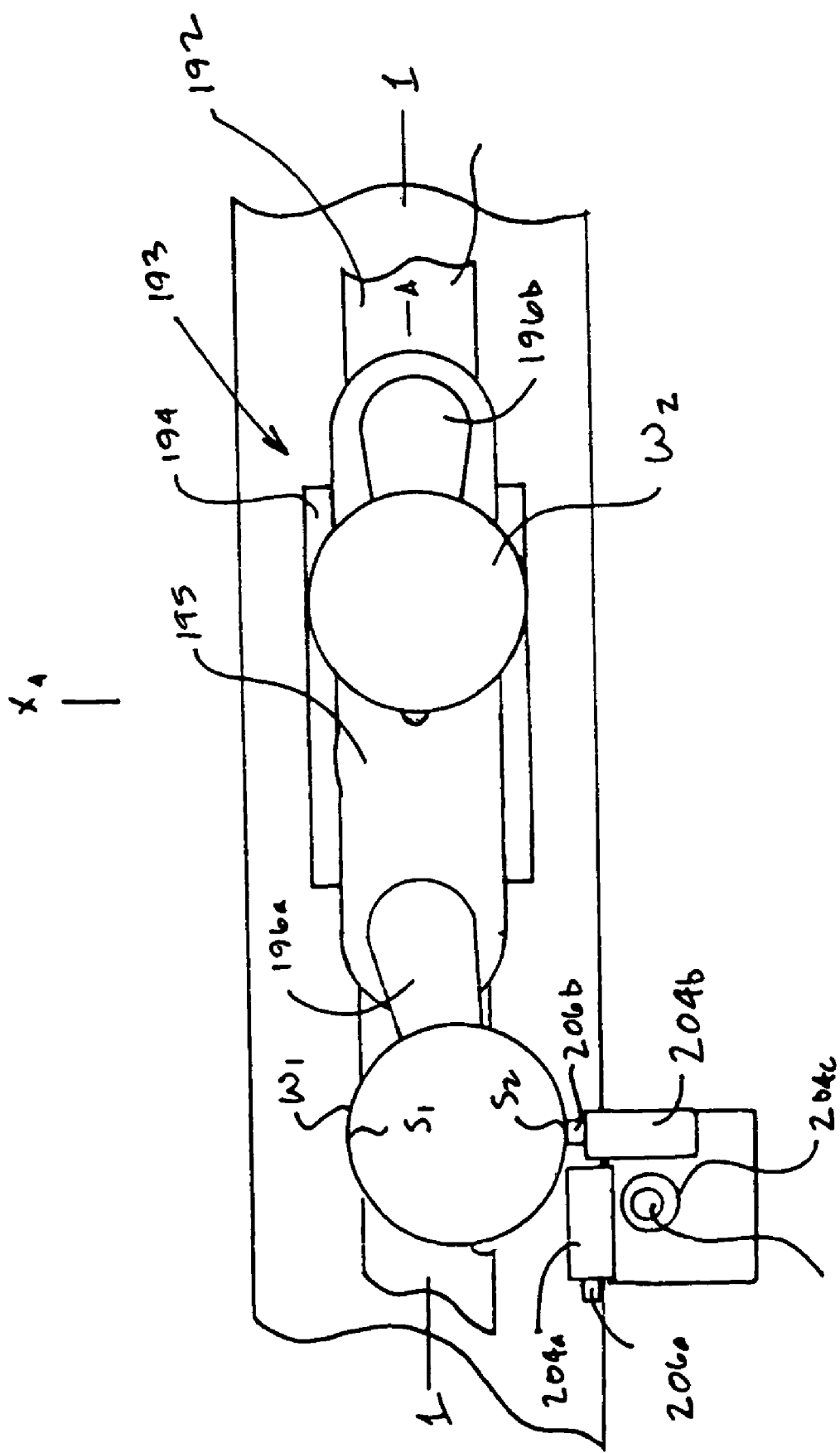

Referring again to FIG. 12, the method 300 can further include an automated end-effector procedure 360 that positions one or both end-effectors in alignment with respect to an axis of the reference frame. Referring to FIG. 16A, the controller 210 rotates the arm 195 until it reaches the encoder value at which the arm axis A-A is aligned with the first reference axis 1-1. The controller also translates the base 194 along the track 192 until the base is positioned at a known location $x_3$ along the first reference axis 1-1. The controller then rotates the first end-effector 196a until a first side $S_1$ of a first wafer $W_1$ engages the second displacement element 206b. The controller 210 receives a signal when the second displacement element 206b reaches a predetermined position and records the encoder value of the rotational position of the first end-effector 196a with respect to the first reference axis 1-1. Referring to FIG. 16B, the controller continues the automated end-effector procedure 360 by translating the base 194 until it is positioned at a predetermined location $x_4$ along the first reference axis 1-1 and rotating the first end-effector 196a until a second side $S_2$ of the workpiece $W_1$ engages the second displacement element 206b. The controller 210 similarly records an encoder value corresponding to the rotational position of the first end-effector 196a relative to the first reference axis 1-1 when the second displacement element 206b reaches a predetermined value. The controller 210 then determines an end-effector offset value according to the encoder values of the first end-effector 196a recorded in the automated end-effector procedure 360 at the stages shown in FIGS. 16A and 16B. The controller 210 can then rotate the first end-effector 196a according to the end-effector offset value to align the first workpiece $W_1$ with the first reference axis 1-1 or another reference axis of the reference frame. The controller 210 can also repeat the automated end-effector procedure 360 for the second end-effector 196b to align the second end-effector 196b with the first reference axis 1-1.

The embodiment of the automated end-effector procedure 360 described above is expected to be highly accurate because it aligns the end-effectors according to the actual position of the workpieces. In production, an end-effector typically holds workpieces at a consistent location on the end-effector. Some end-effectors, however, may consistently hold workpieces out of alignment with the alignment axis of the end-effector. The automated end-effector procedure 360 accurately aligns the end-effectors irrespective of how the end-effectors hold workpieces because the measurements are taken from the perimeter of the workpieces. This eliminates errors from holding workpieces off center with respect to the end-effectors.

The calibration system 300 illustrated in FIG. 12 can have several different embodiments that include fewer procedures, different types of procedures, or additional procedures. For example, the controller 210 can automate the arm input procedure 310 and the base input procedure 320 by adding optical or magnetic sensors to determine the initial rotational value for the arm and the initial axial value for the base. In other embodiments, the method 300 may perform just the automated arm procedure 330 and/or the automated end-effector procedure 360 to accurately position the arm 195 and/or the end-effector 196 along the first reference axis 1-1.

The robot calibration system is particularly valuable when used in combination with the mounting module 120 because it is not necessary to teach the robot the position of each chamber after calibrating the transport system. Because the chambers 170 and the lift-rotate units 180 are mounted to the mounting module 120 at precise locations and the mounting module 120 is dimensionally stable, the locations for loading/unloading the wafers with respect to the chambers are known relative to the reference frame of the mounting module 120. Additionally, when the robot 193 is installed and calibrated using the sensor unit 200 and the controller 210 to accurately align the end-effectors 196a-b in the reference frame, the robot 193 can then operate with the various chambers 170, lift-rotate units 180, and the load/unload module 198 without manually teaching the robot the specific location of each chamber and cassette. As such, the robot 193 can be calibrated to operate with all of the chambers and cassettes in merely a few minutes instead of the several hours that it now takes to manually teach robots the specific location of each chamber and cassette.

The automated calibration system and dimensionally stable mounting module provide significant operating savings because the downtime for maintaining or replacing robots is significantly less compared to conventional tools. Moreover, the downtime for the tool 100 is further reduced for repairing or replacing the chambers 170 and/or the lift-rotate units 180 for the reasons explained above. The integrated tool 100 with the dimensionally stable mounting module 120 and the automated calibration system for the robot 193, therefore, provides a significant advantage over conventional tools that suffer from extensive downtime for routine maintenance.

The robot calibration system can also be operated by teaching the robot 193 the specific location of a component in the tool one time instead of each time the robot or the component is replaced. For example, several components added to the tool 100 may not have positioning elements to interface with the positioning elements on the mounting module 120. The wafer location of such components will not be a known location relative to the reference frame of the mounting module 120. For this application, the components can be attached to the mounting module and then the robot can be taught the specific location of the component. The robot only needs to be taught the specific location once because the mounting module 120 is dimensionally stable. Thus, the robot does not need to relearn the specific location after maintenance or installation.

Another advantage of several embodiments of the calibration system is that the robot is accurately positioned within the reference frame for operating with the chambers 170, the lift-rotate units 180, and the load/unload module 198. One challenge of manually teaching the robot the specific location of each chamber or other component in a tool is that slight calibration errors can result in significant operating errors in production. This can result in chipped or broken wafers when the robot moves the wafers to an incorrect location. Several embodiments of the automated calibration system and the mounting module are expected to reduce such issues because operator error in calibrating the robot is eliminated. It will be appreciated that such accurate calibration of the robot to the other components of the tool 100 eliminates a significant source of frustration for semiconductor fabricators and other operators of integrated tools.

F. Embodiments of End-Effectors

FIGS. 17A-20 illustrate embodiments of the end-effector 196 that can be used with the transport system 190 of the tool 100. These embodiments of the end-effector 196 are quite valuable when used with the automated calibration system described above because they center the workpieces. The end-effector 196 shown in FIGS. 17A-20 are three-point edge-grip end-effectors, but they can have four or more contact points in other embodiments. Several aspects of the end-effectors 196 are similar to the end-effectors described in U.S. Pat. No. 6,318,951 and U.S. application Ser. Nos. 10/194,939 and 10/620,326, all of which are incorporated by reference herein.

FIG. 17A is an isometric view illustrating one embodiment of the end-effector 196. In this embodiment, the end-effector 196 has a body 410, a first passive retainer 420a at a distal end of the body 410, and an active retainer assembly 430 having rollers 450 near a proximal end of the body 410. The body 410 can be solid member, or it can have holes or slots to mitigate backside contamination. The first passive retainer 420a can have a support surface 422 for supporting an edge portion of a workpiece and an edge stop 424 projecting upwardly from the support surface 422. The edge stop 424 can have a contact surface 426 for pressing radially inwardly against a peripheral edge of a workpiece. The first passive retainer 420a can also have an inclined surface 428 sloping downwardly from the support surface. The end-effector 196 can also include second and third passive retainers 420b-c near the active retainer assembly 430 at the proximal end of the body 410. The second and third passive retainers 420b-c can be similar to the first passive retainer 420a. The support surfaces 422 are spaced apart from the body 410 to prevent the workpiece from contacting the body 410 for mitigating contamination of the end-effector 196 and/or the backside of the workpiece.

In operation, the robot 193 (FIGS. 2B and 9) positions the body 410 under a workpiece and raises the end-effector 196 until the workpiece contacts the support surface 422 and/or the guide surfaces 428. The active retainer assembly 430 then moves forward (arrow F) to engage the rollers 450 with the peripheral edge of the workpiece (not shown in FIG. 17A). The end-effector 196 accordingly holds a workpiece between the rollers 450 and the first passive retainer 420a. A workpiece can be removed from the end-effector 196 by moving the active retainer assembly 430 backward (arrow B) to disengage the rollers 450 from the workpiece.

FIG. 17B is an isometric view illustrating details of the active retainer assembly 430 shown in FIG. 17A. In this embodiment, the active retainer assembly 430 includes an actuator 432 and a yolk 436 coupled to the actuator 432. The actuator can be a pneumatic or hydraulic cylinder that moves the yolk 436 along a guide 437. The active retainer assembly 430 can further include a sensor unit 438 to determine the position of the yolk 436. The sensor unit 438 can be coupled to the controller to indicate when the yolk 436 is in a fully retracted position to receive a workpiece or in the fully extended position to securely hold a workpiece on the end-effector 196.

The rollers 450 are rotatably attached to each side of the yolk 436. The embodiment of the end-effector shown in FIG. 17B has two rollers 450 on each side of the yoke 436, but other embodiments can have only a single roller on each side of the yolk 436. The rollers 450 have grooves 452 for receiving the peripheral edge of a workpiece and securely holding the workpiece on the end-effector 196. The rollers 450 accordingly define active retainers for engaging the edge of a workpiece. Other embodiments of the end-effector can have different types of active retainers mounted to the yolk 436 in addition to or in lieu of the rollers 450.

Figure 18:
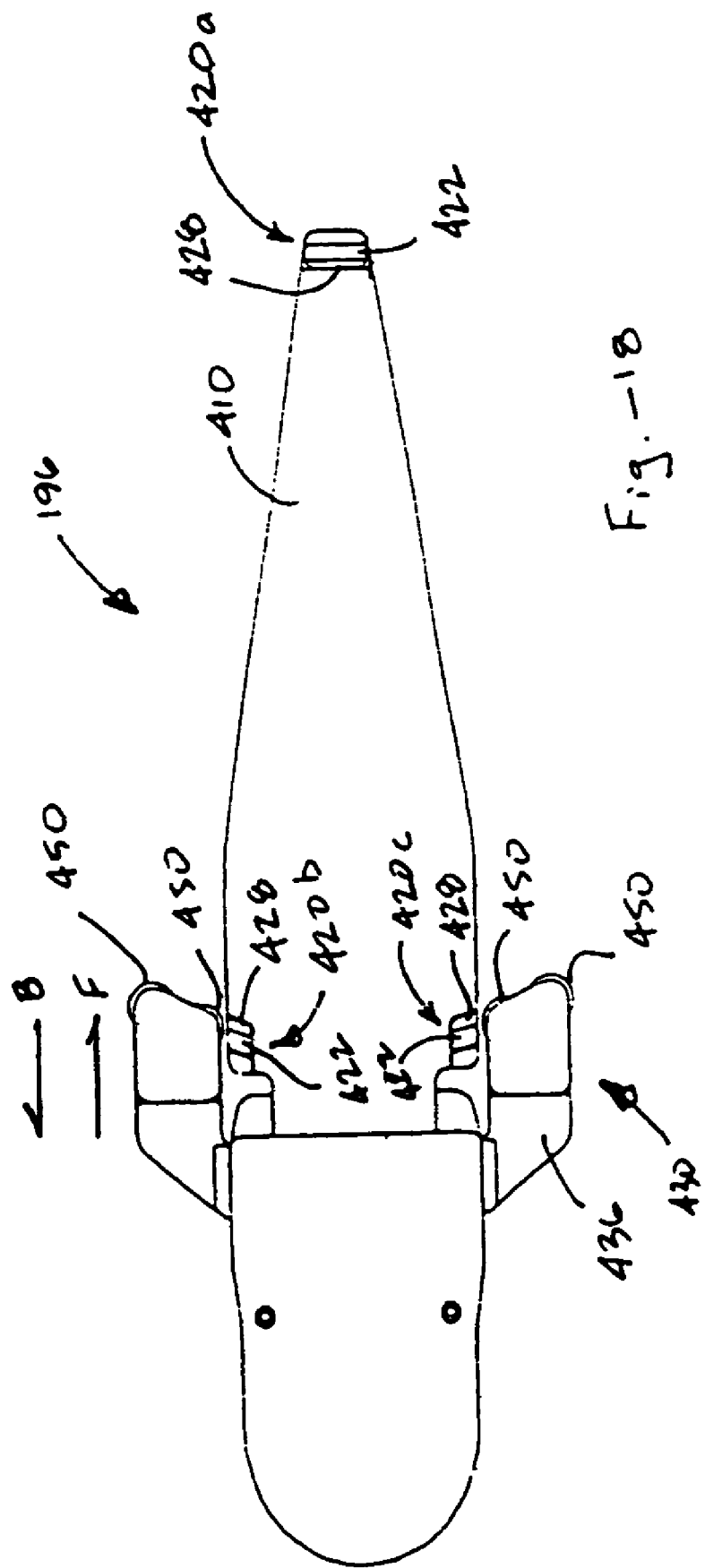
FIG. 18 is a top plan view of the end-effector shown in FIGS. 17A and 17B.
Figure 19:
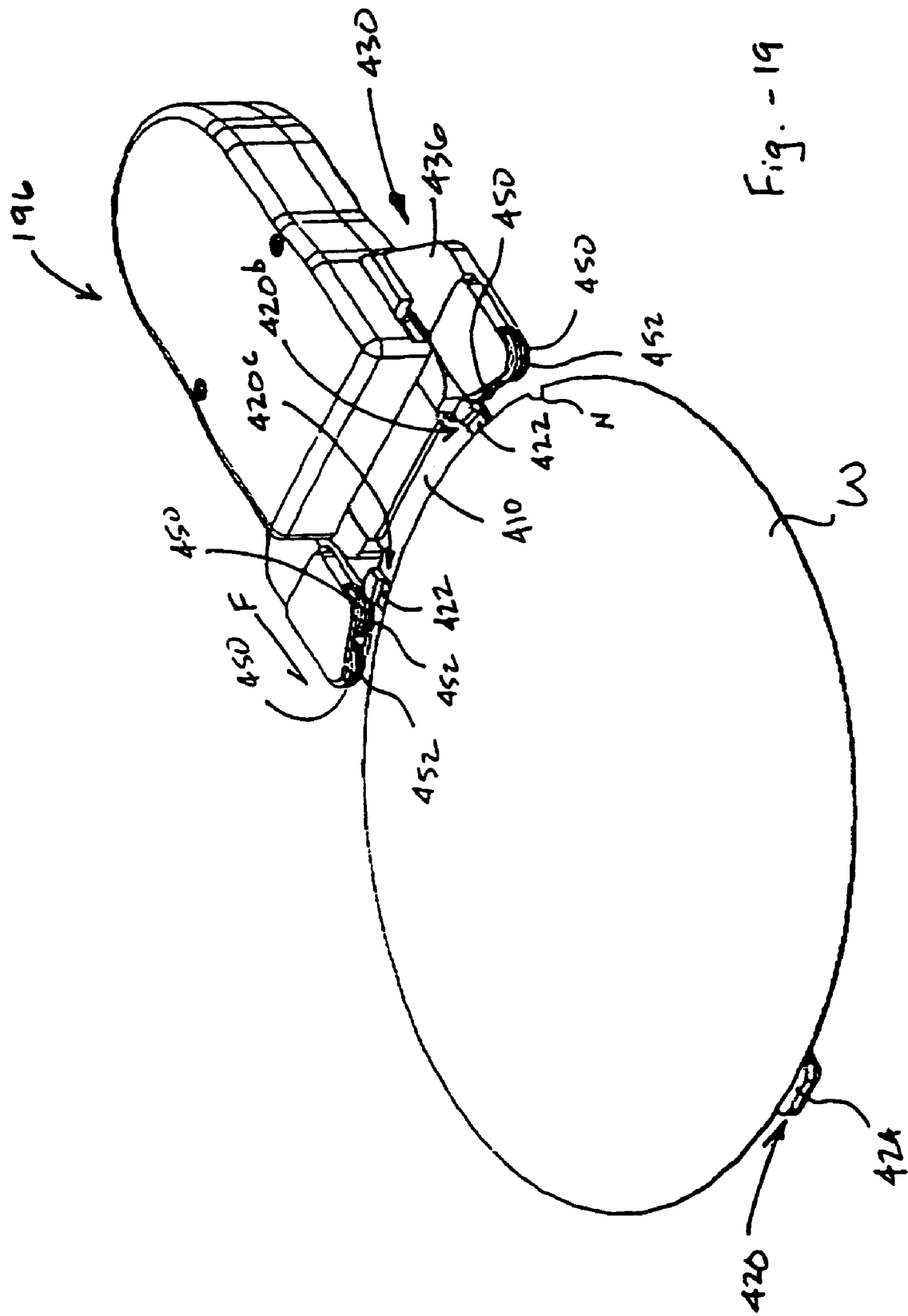
FIG. 19 is an isometric view of the end-effector shown in FIGS. 17A and 17B.

FIG. 18 is a top plan view of the end-effector 196 and FIG. 19 is an isometric view of the end-effector 196 with a workpiece W. These Figures further illustrate the purpose of the rollers 450 in more detail. More specifically, as the active retainer assembly 430 moves forward (arrow F) to hold the peripheral edge of the workpiece W in the grooves 452 of the rollers 450, the workpiece W is centered as it is clamped between the first passive retainer 420a and the rollers 450. For example, if the workpiece is skewed relative to the body 410, the workpiece W will rotate along the rollers 450 as the yolk 436 moves in the forward direction F. The movement of the rollers 450 accordingly centers the workpiece W relative to the body 410. Moreover, by having two rollers 450 in a stepped or angled arrangement on each side of the yolk 436, the rollers 450 cause the workpiece W to rotate relative to the body 410 even when an alignment notch N (FIG. 19) is positioned at one of the rollers 450.

Figure 20:
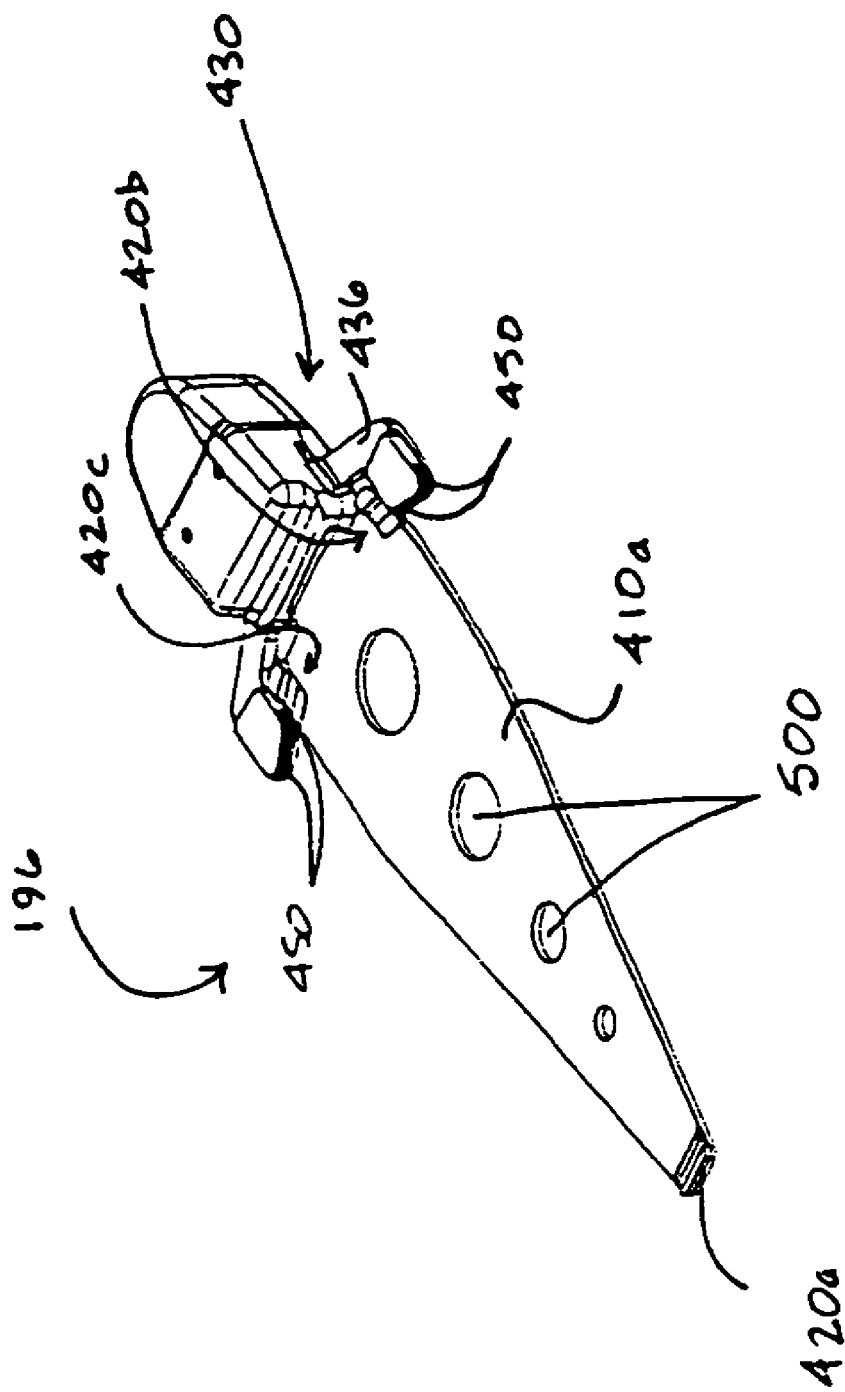
FIG. 20 is an isometric view of another embodiment of an end-effector for use in a transport system in accordance with another embodiment of the invention.

FIG. 20 is an isometric view of another embodiment of the end-effector 196. This embodiment is similar to the embodiment shown in FIGS. 17A-19, and like reference numbers refer to like components in FIGS. 17A-20. The embodiment of the end-effector 196 in FIG. 20 has a body 410a with a plurality of openings 500. The openings 500 can be circular, rectilinear or any other suitable shape. The openings 500 reduce the weight of the body to reduce the inertia of the end-effector 196. This is useful for large end-effectors used with 300 mm workpieces.

The embodiments of the end-effectors 196 shown in FIGS. 17A-20 are expected to provide more accurate handling of the workpieces W to increase the accuracy with which the robot 193 can transfer workpieces within the tool 100. By centering a workpiece W to the body 410, these embodiments of the end-effector 196 insure a consistent placement of the workpiece W relative to the other portions of the robot 193. As a result, these embodiments of the end-effector 196 are expected to eliminate or at least mitigate one source of error in automatically calibrating the robot 193 to accurately transfer workpieces among the chambers 170, lift-rotate units 180, and the load/unload module 198.

From the foregoing, it will be appreciated that specific embodiments of the invention have been described herein for purposes of illustration, but that various modifications may be made without deviating from the spirit and scope of the invention. Accordingly, the present invention is not limited except as by the appended claims.

We claim:

1. In a tool having (a) a plurality of stations for processing microfeature workpieces at known locations relative to a reference frame, (b) cassettes for holding workpieces at known locations relative to the reference frame, (c) an automated workpiece handling system with a robot having a base unit, an arm rotatably coupled to the base unit, and an end-effector rotatably coupled to the arm, and (d) a controller operatively coupled to the automated workpiece handling system, a method of calibrating the robot to the reference frame comprising:

providing an initial rotational alignment value indicative of alignment of an arm axis of the arm to a first axis of the reference frame and providing an initial axial position value indicative of a location of the base unit along the first axis;

operating the controller to execute a computer operable medium that automatically—

(a) aligns the arm axis of the arm with the first axis by contacting a first end of the arm with a rotational reference sensor at a know location relative to the reference frame, recording a first displacement value indicative of a first angle between the arm axis and the first axis, contacting a second point of the arm with the rotational sensor, recording a second displacement value indicative of a second angle between the arm axis and the first axis, and moving the arm according to an arm offset value based upon the first and second displacement values to align the arm axis with the first axis;

(b) refines the initial axial position value for the base by rotating the arm to a reference angle relative to the first axis and contacting the arm with an axial sensor at a known location relative to the reference frame to determine an actual location of the base along the first axis; and (c) aligns the end-effector to the first axis by contacting a first side of a workpiece loaded on the end-effector to the rotational reference sensor, recording a first end-effector displacement value, contacting a second side of the workpiece loaded on the end-effector to the rotational reference sensor, recording a second end-effector displacement value, and moving the end-effector according to an end-effector offset value based upon the first and second end-effector displacement values.

2. In a tool having (a) a plurality of stations for processing microfeature workpieces, (b) an automated workpiece handling system with a robot having a base unit, an arm moveably coupled to the base unit, and an end-effector rotatably attached to the arm, and (c) a controller operatively coupled to the workpiece handling system, a method of calibrating the robot to a reference frame of the tool comprising:

operating the controller to execute a computer operable medium that—

(a) automatically aligns an axis of the arm with a first axis of the reference frame by contacting the arm with a rotational reference sensor to obtain an arm offset value relative to the first axis and moving the arm according to the arm offset value to position the arm axis with the first axis; and (b) automatically aligns the end-effector to the first axis by contacting a first side of a workpiece loaded on the end-effector with the rotational reference sensor, recording a first end-effector displacement value, contacting a second side of the workpiece loaded on the end-effector with the rotational reference sensor, recording a second end-effector displacement value, and moving the end-effector according to an end-effector offset value based upon the first and second end-effector displacement values.

3. In a tool having (a) a dimensionally stable mounting module, (b) a plurality of stations for processing microfeature workpieces at known locations relative to the mounting module, (c) cassettes for holding workpieces at known locations relative to the mounting module, (d) a rotational sensor at a known location relative to the mounting module, (e) an automated workpiece handling system with a robot having a base unit mounted to the mounting module, an arm rotatably attached to the base, and an end-effector rotatably attached to the arm, and (f) a controller operatively coupled to the workpiece handling system, a method of aligning a hand axis of the end-effector to a first reference axis of a reference frame of the mounting module comprising:

loading a workpiece on the end-effector; and operating the controller to execute a computer operable medium that automatically moves the robot to contact a first side of the workpiece with the rotational reference sensor, records a first end-effector displacement value, moves the robot to contact a second side of the workpiece with the rotational reference sensor, records a second end-effector displacement value, determines an end-effector offset value indicative of an offset angle between the hand axis of the end-effector and the first reference axis of the reference frame, and moves the end-effector to align the hand axis with the first reference axis according to the end-effector offset value.

4. A workpiece handling system for handling a microfeature workpiece in an integrated processing tool having a plurality of processing chambers at known positions relative to a reference frame and cassettes at known positions relative to the reference frame, the handling system comprising:

a robot having a base in the tool, an arm rotatably attached to the base, and an end-effector rotatably attached to the arm; and a controller having a computer operable medium containing instructions that (a) automatically aligns an axis of the arm with a first axis of the reference frame by moving the arm to contact a rotational reference sensor, recording an arm offset value relative to the first axis, and repositioning the arm according to the arm offset value to align the arm axis with the first axis, and (b) automatically aligns the end-effector to the first axis by moving the end-effector to contact a first side of a workpiece loaded on the end-effector with the rotational reference sensor, recording a first end-effector displacement value, moving the end-effector to contact a second side of the workpiece loaded on the end-effector with the rotational reference sensor, recording a second end-effector displacement value, and repositioning the end-effector according to an end-effector offset value based upon the first and second end-effector displacement values.

5. An integrated tool for processing a microfeature workpiece, comprising:

a dimensionally stable mounting module defining a reference frame with a first reference axis;

a plurality of processing stations mounted to the mounting modules at known locations;

a cassette for holding workpieces before and/of after being processed in at least one of the processing stations;

an automated workpiece handling system having a track attached to the mounting module and aligned with the first reference axis of the reference frame, a base unit moveably attached to the track to translate along the track, an arm rotatably carried by the base, and an end-effector rotatably carried by the arm;

a sensor unit having rotation sensor at a known location relative to the reference frame of the mounting module; and a controller operatively coupled to the automated workpiece handling system and the sensor unit, the controller having a computer operable medium containing instructions to (a) automatically position an arm axis of the arm at an origin position relative to the first reference axis, and (b) automatically position a hand axis of the end-effector at an origin position relative to the first axis.

6. An integrated tool for processing a microfeature workpiece, comprising:

a dimensionally stable mounting module defining a reference frame;

a plurality of processing stations mounted to the mounting modules at known locations;

a cassette for holding workpieces before and/of after being processed in at least one of the processing stations; and an automated workpiece handling system having a base unit carried by the mounting module, an arm rotatably carried by the base unit, and an end-effector rotatably carried by the arm, wherein the end-effector has a body, a first retaining element at one end of the body, and an active retaining assembly at another end of the body, and wherein the active retaining assembly has first and second rollers and an actuator operatively coupled to the first and second rollers to move the rollers toward the first retaining element.

7. An integrated tool for processing a microfeature workpiece, comprising:

a dimensionally stable mounting module defining a reference frame with a first reference axis;

a plurality of processing stations mounted to the mounting modules at known locations;

a cassette for holding workpieces before and/of after being processed in at least one of the processing stations;

an automated workpiece handling system having a base unit carried by the mounting module, an arm rotatably carried by the base unit, and an end-effector rotatably carried by the arm, wherein the end-effector has a body, a first retaining element at one end of the body, and an active retaining assembly at another end of the body, and wherein the active retaining assembly has first and second rollers and an actuator operatively coupled to the first and second rollers to move the rollers toward the first retaining element;

a sensor unit having rotation sensor at a known location relative to the reference frame of the mounting module; and a controller operatively coupled to the automated workpiece handling system and the sensor unit, the controller having a computer operable medium containing instructions to (a) automatically position an arm axis of the arm at an origin position relative to the first reference axis, and (b) automatically position a hand axis of the end-effector at an origin position relative to the first axis.

* * * * *